(12) United States Patent
Tseng

(10) Patent No.: US 8,608,504 B2
(45) Date of Patent: Dec. 17, 2013

(54) CONNECTOR AND CONNECTOR ASSEMBLY USED FOR TRANSMITTING LOW-SPEED SIGNAL AND/OR HIGH-SPEED SIGNAL

(75) Inventor: Ting-Cheng Tseng, New Taipei (TW)

(73) Assignee: Bing Xu Precision Co., Ltd., New Taipei (TW)

( * ) Notice: Subject to any disclaimer, the term of this patent is extended or adjusted under 35 U.S.C. 154(b) by 0 days.

(21) Appl. No.: 13/244,644

(22) Filed: Sep. 25, 2011

(65) Prior Publication Data

US 2012/0190217 A1 Jul. 26, 2012

(30) Foreign Application Priority Data

Jan. 20, 2011 (TW) .............................. 100201265 U
Apr. 18, 2011 (TW) .............................. 100206797 U

(51) Int. Cl.
*H01R 12/24* (2006.01)

(52) U.S. Cl.
USPC .......................................... 439/497; 439/326

(58) Field of Classification Search
USPC .......................................... 439/497, 326, 495
See application file for complete search history.

(56) References Cited

U.S. PATENT DOCUMENTS

| 3,424,854 | A | * | 1/1969 | Baxter ......................... | 174/262 |
| 4,249,302 | A | * | 2/1981 | Crepeau ......................... | 29/830 |
| 5,387,113 | A | * | 2/1995 | Dickerson et al. .............. | 439/98 |
| 5,509,827 | A | * | 4/1996 | Huppenthal et al. .......... | 439/638 |
| 7,156,678 | B2 | * | 1/2007 | Feldman et al. ............... | 439/326 |
| 7,374,429 | B2 | * | 5/2008 | Cronch et al. .................. | 439/67 |
| 8,011,950 | B2 | * | 9/2011 | Mcgrath et al. ............... | 439/497 |
| 8,345,436 | B2 | * | 1/2013 | Kitada et al. .................. | 361/777 |

FOREIGN PATENT DOCUMENTS

TW M371317 12/2009

* cited by examiner

*Primary Examiner* — Phuong Dinh

(57) ABSTRACT

A connector and a connector assembly are provided by the invention. The connector includes a main body formed by a printed circuit board and a plurality of cables. The printed circuit board has a surface conductive trace layer, an inner insulation layer, a ground layer and a surface insulation layer. The surface conductive trace layer has a conductive trace pattern comprising a plurality of contacting-end pattern portions and a plurality of bonding pad portions. The inner insulation layer is located on the surface conductive trace layer. The ground layer is located on the inner insulation layer. The surface insulation layer overlays the ground layer and exposes out a part of the ground layer. The cables are electrically connected to the bonding pad portions of the conductive trace patterns.

20 Claims, 31 Drawing Sheets

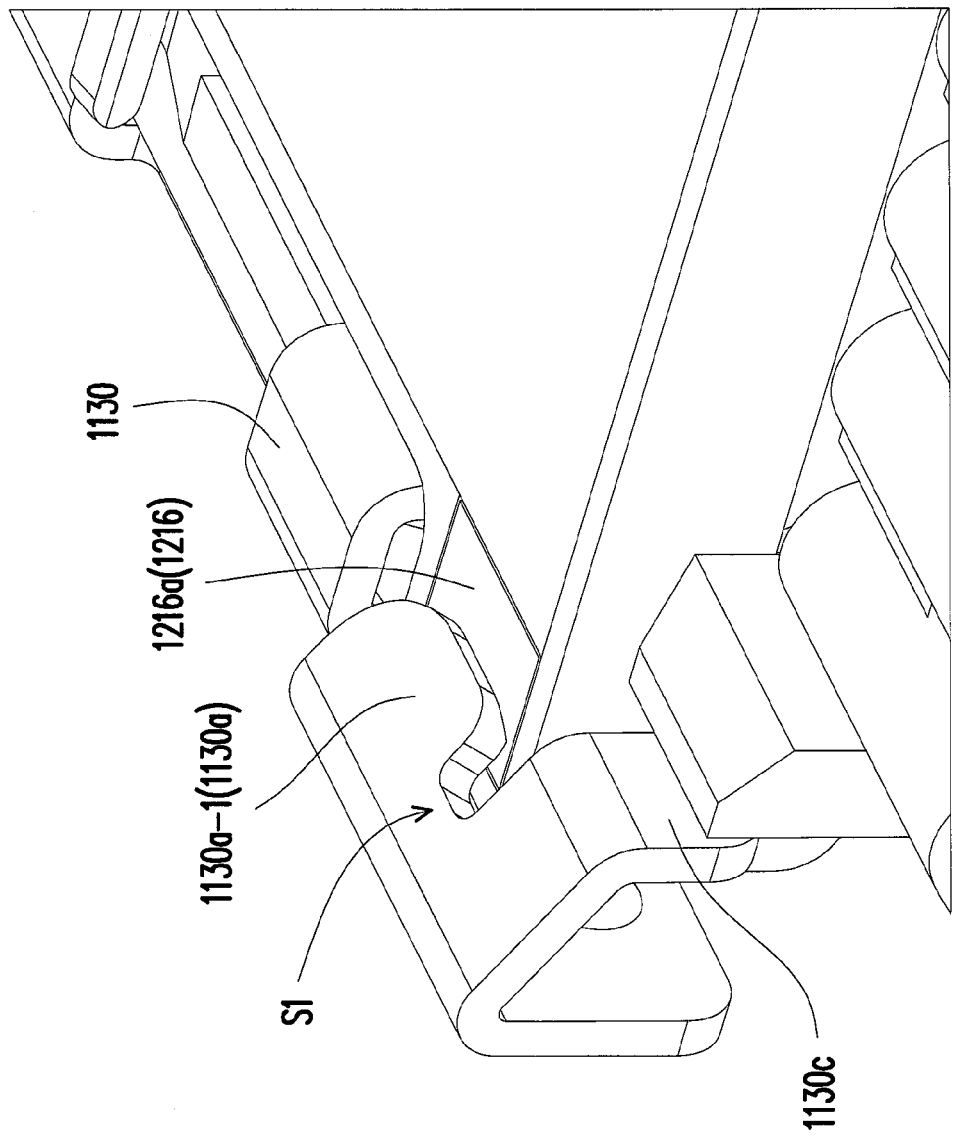

CONNECTOR AND CONNECTOR ASSEMBLY USED FOR TRANSMITTING LOW-SPEED SIGNAL AND/OR HIGH-SPEED SIGNAL

CROSS-REFERENCE TO RELATED APPLICATION

This application claims the priority benefits of Taiwan application serial no. 100201265, filed on Jan. 20, 2011, and Taiwan application serial no. 100206797, filed on Apr. 18, 2011. The entirety of each of the above-mentioned patent applications is hereby incorporated by reference herein and made a part of specification.

BACKGROUND OF THE INVENTION

1. Field of the Invention

The present invention generally relates to a connector and a connector assembly, and more particularly, to a connector and a connector assembly used for transmitting low-speed signal and/or high-speed signal.

2. Description of Related Art

The prior art, for example, ROC Patent No. M371317 filed on Aug. 10, 2009 discloses a 'SATA connector', referring to FIGS. 19 and 20, which respectively show a 3-dimensional exploded schematic diagram of a conventional SATA connector and a schematic assembly diagram thereof. The conventional SATA connector is composed of a first connector 1 and a second connector 2. The connector 1 includes an insulation body 10, two terminal sets 20 and 30, a ground terminal 37, a cable 40, a metallic shell 50 and a pull band 57. In the diagram, P represents a motherboard. In the prior art, the terminal sets 20 and 30 of the connector 1 are plugged into the connector 2 in vertically inserting way (FIG. 20) with a larger inserting force and the connector 1 is uneasily plugged/unplugged, so that a pull band 57 is employed herein. Moreover, the connector 1 is vertically assembled into the connector 2, the overall thickness of the conventional SATA connector is limited to be reduced and the design needs to be improved.

In addition, since the terminal sets 20 and 30 are bent at a vertically upper place, in which the bending portions with small area serve as soldering places for externally connecting the cable, so that the areas available for soldering operation are small. In particular, the bending design of the terminals would cause an up-down-step during transmitting signals, which easily affects the transmission quality.

SUMMARY OF THE INVENTION

Accordingly, the present invention is directed to a connector and a connector assembly, in which in comparison with the prior art, the connector after assembling has a reduced overall thickness and advanced transmission quality during transmitting signals. The connector is not only suitable for SATA specification, but also for connecting electronic apparatuses with other different specifications.

According to a first technical scheme of the present invention, a connector is provided, which is a cable-side connector comprising a main body formed by a printed circuit board and a plurality of cables. The printed circuit board comprises a surface conductive trace layer, an inner insulation layer, a ground layer and a surface insulation layer. The surface conductive trace layer has a conductive trace pattern comprising a plurality of contacting-end pattern portions and a plurality of bonding pad portions. The inner insulation layer is located on the surface conductive trace layer. The ground layer is located on the inner insulation layer. The surface insulation layer overlays the ground layer and exposes out a part of the ground layer. The cables are electrically connected to the bonding pad portions of the conductive trace patterns.

According to a second technical scheme of the present invention, a connector is provided, which is a board-side connector comprising an insulation base, a plurality of first terminals and a shielding shell. The insulation base comprises a second foolproof structure and a plurality of slots. The second foolproof structure is a lengthwise rib or a lengthwise recess. The first terminals are respectively inserted at the slots and respectively have a protrusive portion protruded from the slots. The shielding shell encloses a part of the insulation base and exposes out the protrusive portions of the first terminals and the portions of the slots close to the protrusive portions, in which the protrusive portions of first terminals and the shielding shell together form a guiding path. The shielding shell comprises an electrical leaning portion suitable for electrically connecting the ground portion of a cable-side connector to form an electromagnetic shielding structure. The shielding shell has two inward protrusive portions at both sides thereof to limit a movement of the cable-side connector.

In the above-mentioned first technical scheme, the inner insulation layer (insulation core layer) has an aligning hole going through the inner insulation layer. The above-mentioned first technical scheme further comprises an insulation cover and a holding part. The insulation cover and the printed circuit board together clamp the cables and the insulation cover comprises at least one leaning portion suitable to lean against a motherboard. The holding part goes through the aligning hole and the motherboard to fix the cable-side connector to the motherboard.

In the above-mentioned second technical scheme, the insulation base is suitable for a holding part to go through itself so as to fix the cable-side connector.

The present invention has a beneficial effect that by using the guiding path and obliquely inserting design, the cable-side connector can be more handy and easier inserted to the board-side connector and the overall height of the connector assembly after assembling the cable-side connector and the board-side connector can be reduced.

The present invention has another beneficial effect that by means of specific design of the printed circuit board, the contacting-end pattern portion can be defined at the surface conductive trace layer and the required ground pattern can be defined at the ground layer. As a result, the connections of the contacting-end can be easier defined according to the practice requirement so as to increase the design flexibility. In addition, the employed printed circuit board also features by specific designs of the contacting-end pattern portions, circuit wiring and insulation base, so that the total part number of the connector is further reduced and a less production cost is accordingly achieved.

The present invention has yet another beneficial effect that both the cable-side connector and the board-side connector are contacted on the motherboard through a leaning portion, and a holding part goes through an aligning hole of the printed circuit board to be fixed at the motherboard, which simplifies the connection structure between the above-mentioned two connectors, cuts down the connection part number and reduces the production cost. In addition, the shielding shell of the cable-side connector has a leaning portion suitable to lean against the motherboard so as to support the two connectors during fixing and to avoid the two connectors or the motherboard from damage due to over-pressing.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6A is a partially enlarged perspective view corresponding to part A of FIG. 3.

DESCRIPTION OF THE EMBODIMENTS

Figure 1:
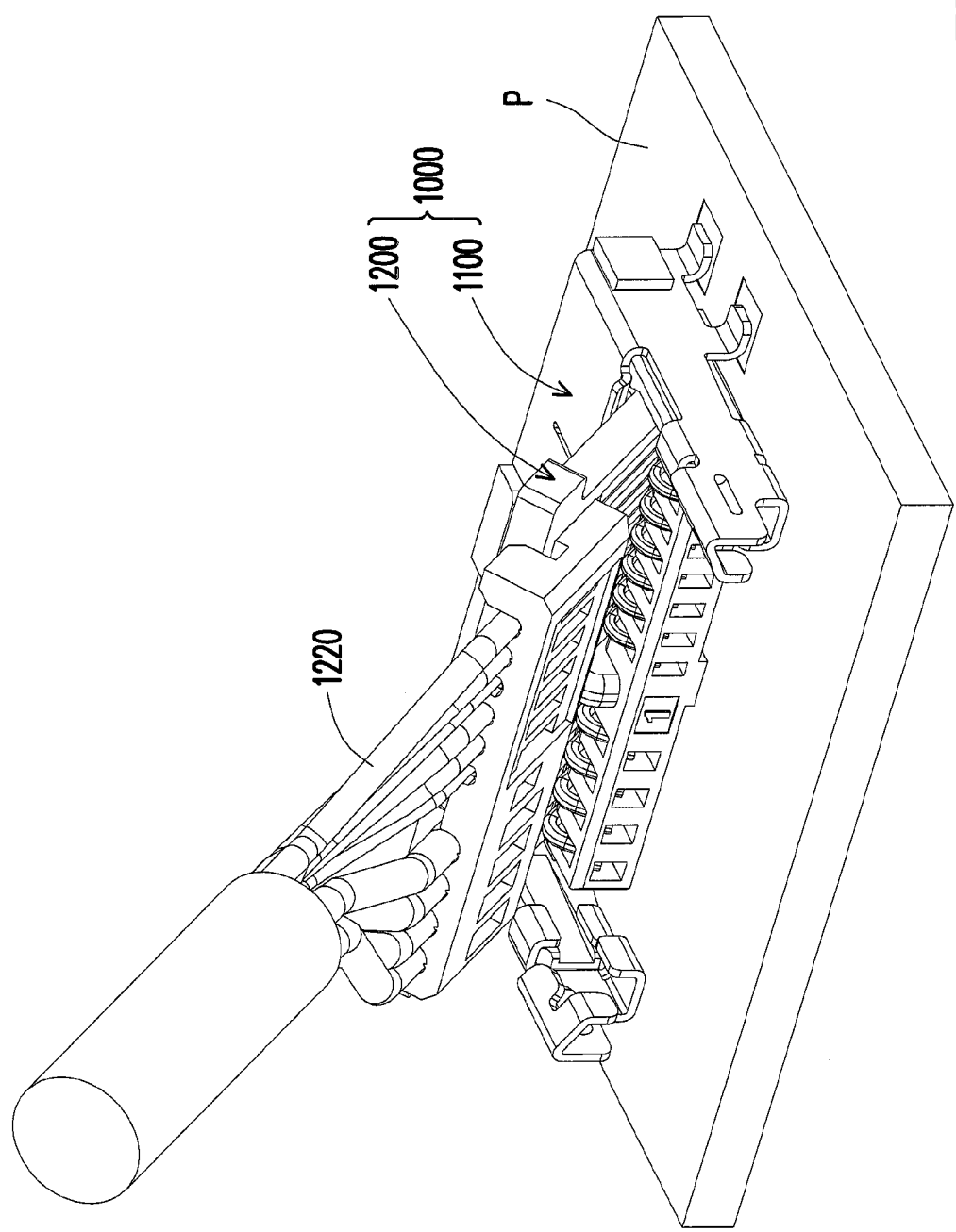
FIG. 1 is a perspective view of a connector assembly before assembling according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a perspective view of a connector assembly 1000 according to a first embodiment of the present invention. Referring to FIG. 1, the connector assembly 1000 includes a board-side connector 1100 and a cable-side connector 1200. The board-side connector 1100 is suitable to be fixed to a motherboard. P and the cable-side connector 1200 is suitable to assist the motherboard P and other apparatuses in performing electronic signals transmission.

Figure 2:
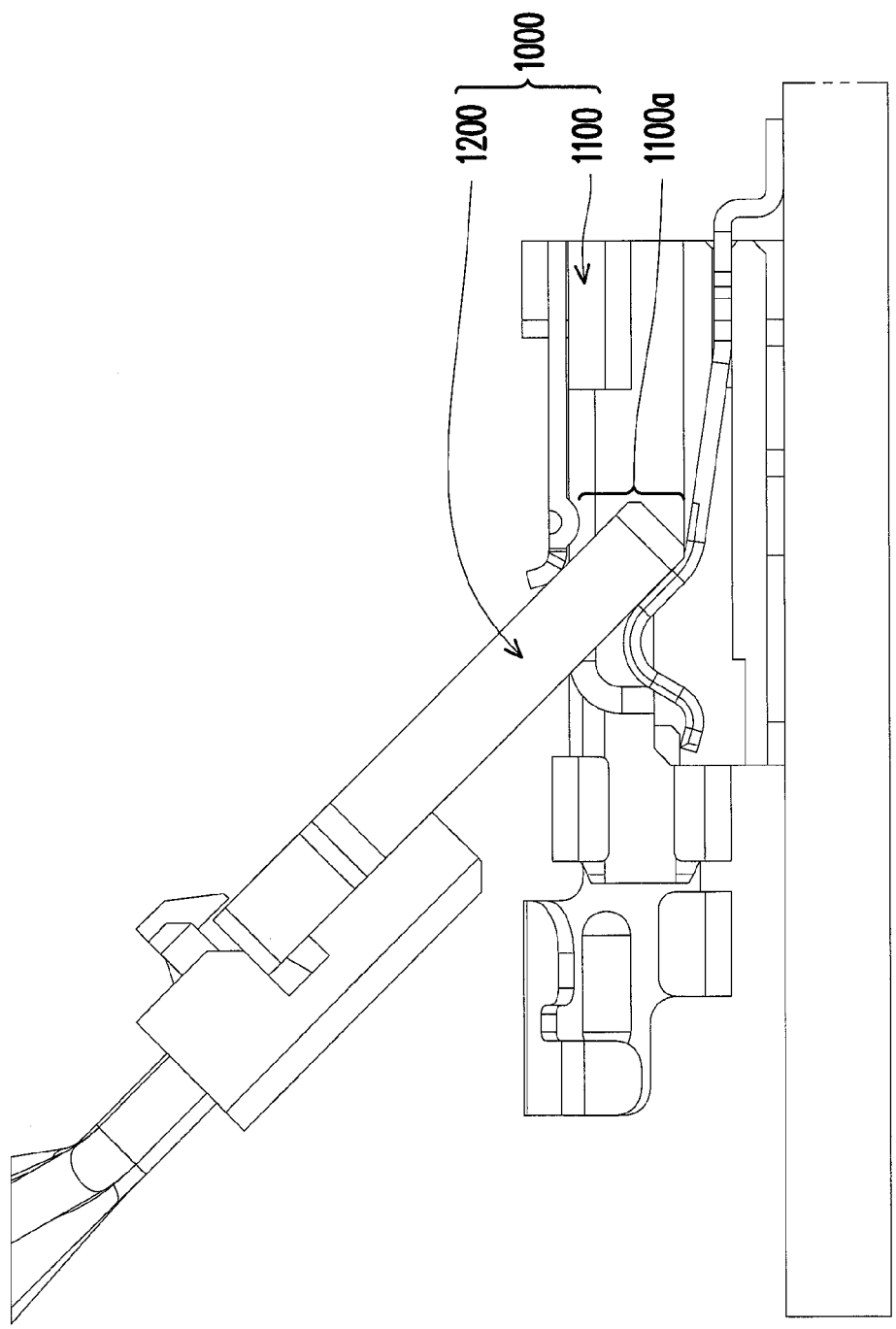
FIG. 2 is a side-view cross-sectional diagram of FIG. 1.

Referring to FIG. 2, the board-side connector 1100 has an obliquely guiding path 1100a for the cable-side connector 1200 to be obliquely inserted and assembled to the board-side connector 1100. In this way, when the cable-side connector 1200 is assembled to the board-side connector 1100 along the obliquely guiding path 1100a, the assembling job can be done more handy and easier. In addition, the overall height of the connector assembly 1000 after assembling the cable-side connector 1200 and the board-side connector 1100 can be reduced Referring to FIG. 3, the board-side connector 1100 has a shielding shell 1130 and the cable-side connector 1200 has another printed circuit board 1210. The printed circuit board 1210 is, for example, a main body formed by a single-layer printing printed circuit board or a laminated printing printed circuit board. The shielding shell 1130 is electrically connected to an exposed ground portion 1216 of the printed circuit board 1210 so as to form an electromagnetic shielding structure S.

Cable-Side Connector

Figure 5A:
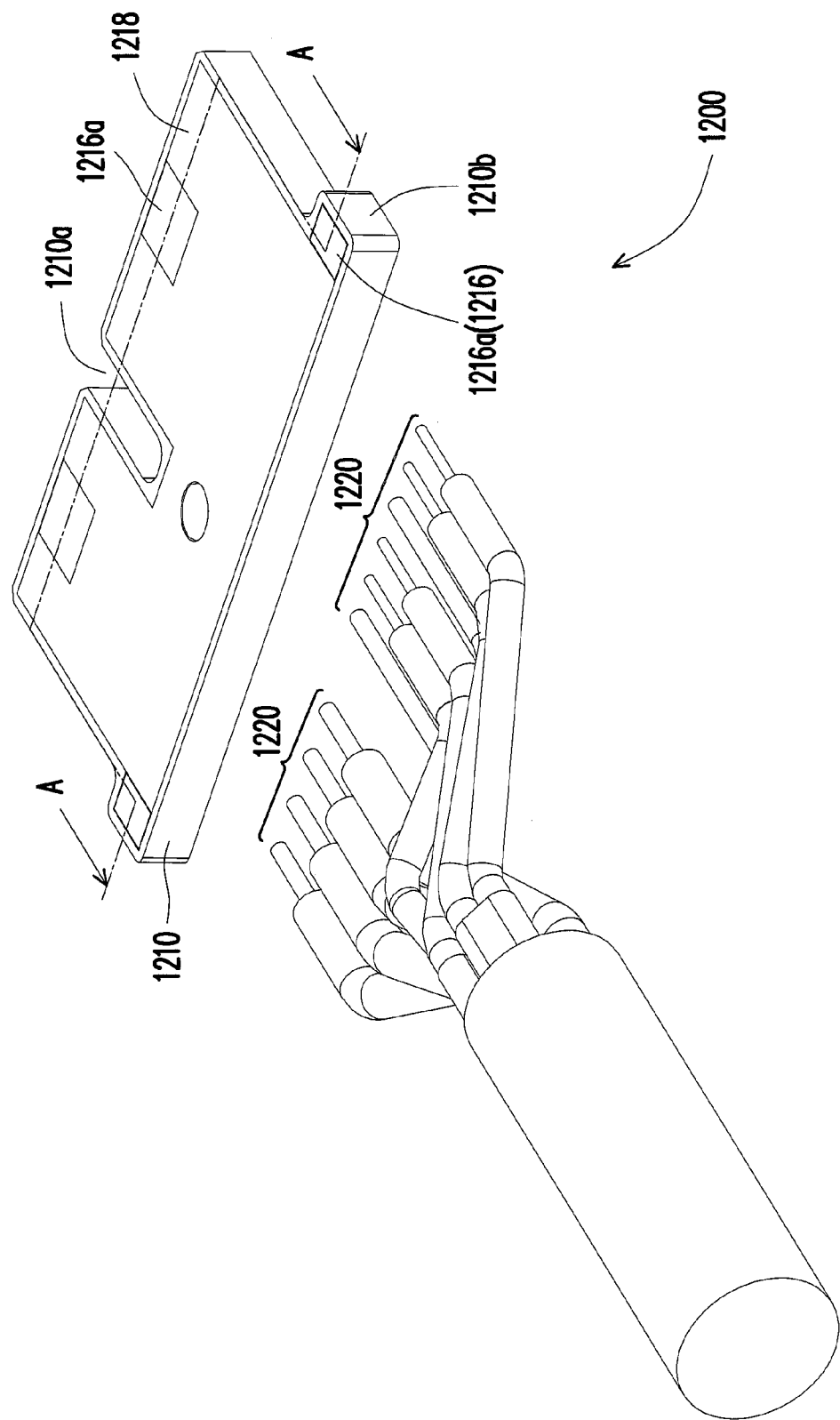
FIG. 5A is a perspective exploded schematic diagram of the cable-side connector of FIG. 3.
Figure 5B:
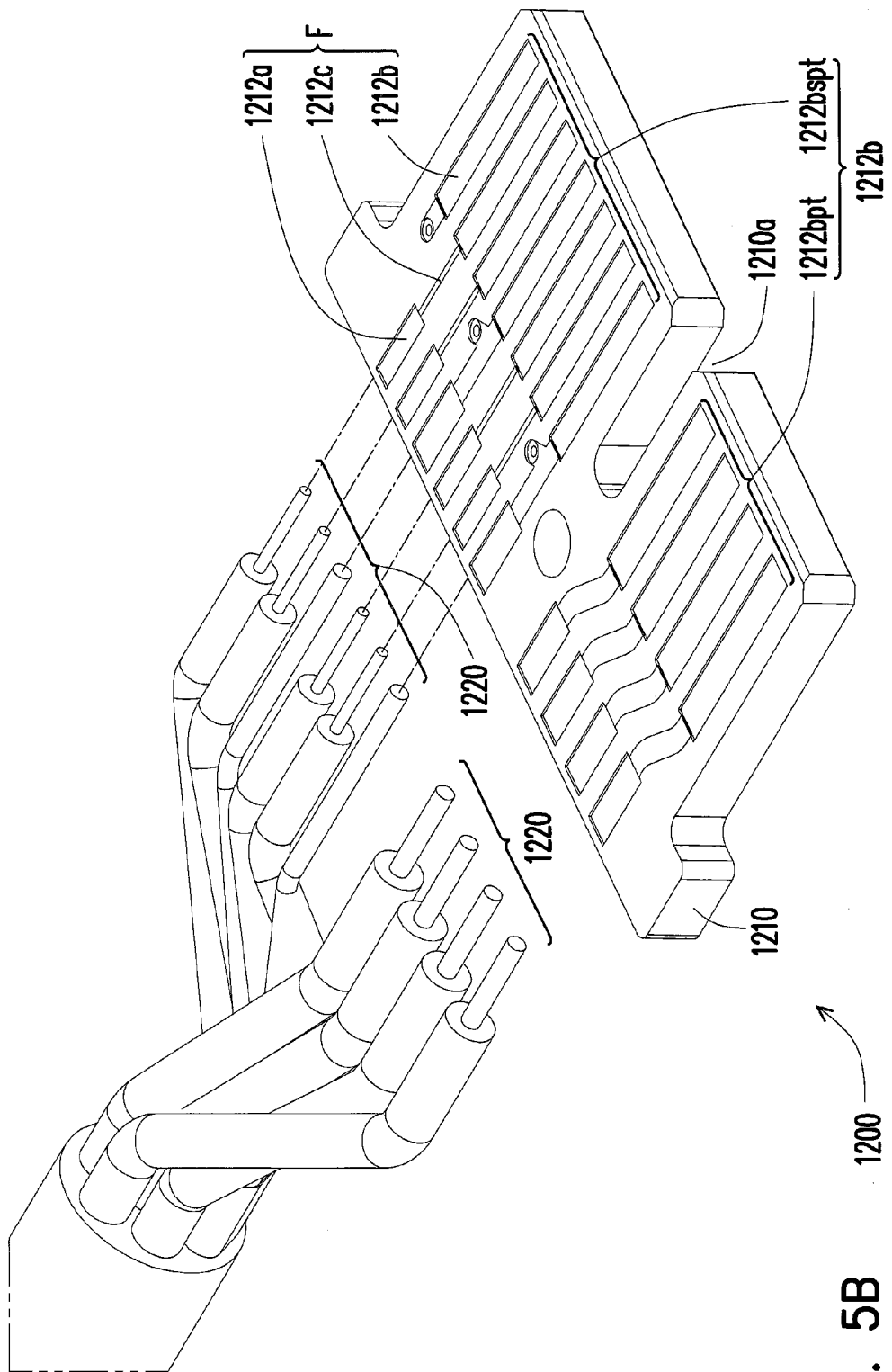
FIG. 5B is a perspective exploded schematic diagram in another angle of viewing of the cable-side connector of FIG. 5A.
Figure 5C:
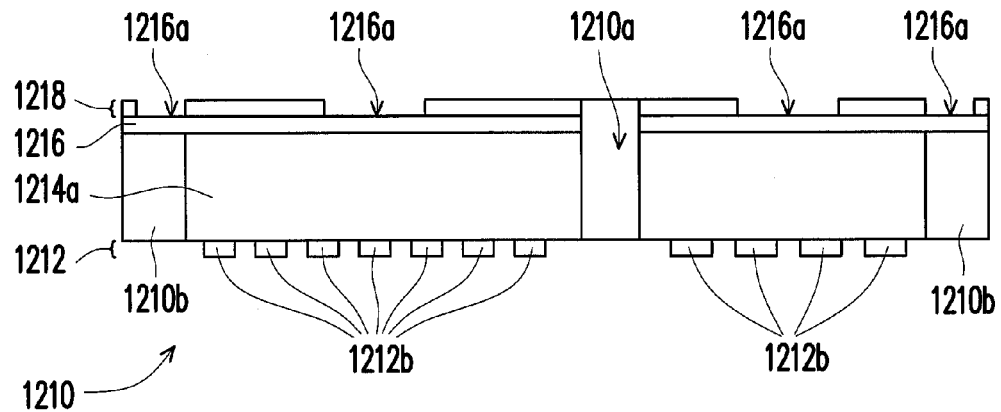
FIG. 5C is a cross-sectional diagram of the printed circuit board of the cable-side connector in FIG. 5A along line A-A.

Referring to FIGS. 5A, 5B and 5C, the cable-side connector 1200 is suitable to assist the motherboard P (shown by FIG. 3) and other apparatuses in performing electronic signals transmission. The cable-side connector 1200 includes the printed circuit board 1210 and a plurality of cables 1220.

As shown by FIG. 5C, the printed circuit board 1210 has a surface conductive trace layer 1212, an inner insulation layer 1214a, a ground layer 1216 and a surface insulation layer 1218. The inner insulation layer 1214a is located on the surface conductive trace layer 1212. The ground layer 1216 is located on the inner insulation layer 1214a. The surface insulation layer 1218 overlays the ground layer 1216 and exposes out a part of the ground layer 1216, in which the ground layer is marked with 1216 and the exposed part on the ground layer 1216 is accordingly marked with 1216a. The surface conductive trace layer 1212 has a conductive trace pattern F which includes a plurality of bonding pad portions 1212a and a plurality of contacting-end pattern portions 1212b (commonly known as golden finger). In addition, the conductive trace pattern F can further include connection portions 1212c located between the bonding pad portion 1212a and the contacting-end pattern portion 1212b for connecting the bonding pad portion 1212a and the contacting-end pattern portion 1212b. It should be noted that in another unshown embodiment, the connection portion 1212c can be saved, and instead, the bonding pad portions 1212a extend to connect the contacting-end pattern portions 1212b or the contacting-end pattern portions 1212b extend to connect the bonding pad portions 1212a. The cables 1220 are electrically connected to the bonding pad portions 1212a of the surface conductive trace layer 1212. In this way, the main body of the cable-side connector 1200 is formed by the printed circuit board 1210 so as to have a thinner thickness. After the cable-side connector 1200 is assembled to the board-side connector 1100, the design can further reduce the overall height of the assembly of the two connectors and the part number can be cut down by using the printed circuit board.

Figure 5D:
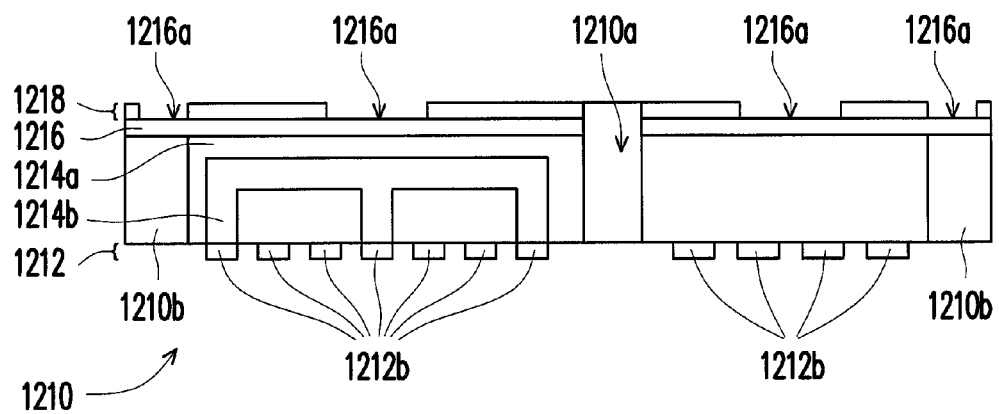
FIGS. 5D-5F are schematic diagrams showing several modifications of the printed circuit board in FIG. 5C.

In FIG. 5D, an inner conductive trace layer 1214b is added, which is located in the inner insulation layer 1214a and between the surface conductive trace layer 1212 and the ground layer 1216 for electrically connecting some of the contacting-end pattern portions 1212b in the surface conductive trace layer 1212. For example, when the terminals of other apparatuses coupled by some of the contacting-end pattern portions 1212b are together connected to a reference level (for example, grounding), the inner conductive trace layer 1214b can be used to electrically connect the above-mentioned terminals inside the printed circuit board 1210 together.

Figure 5E:
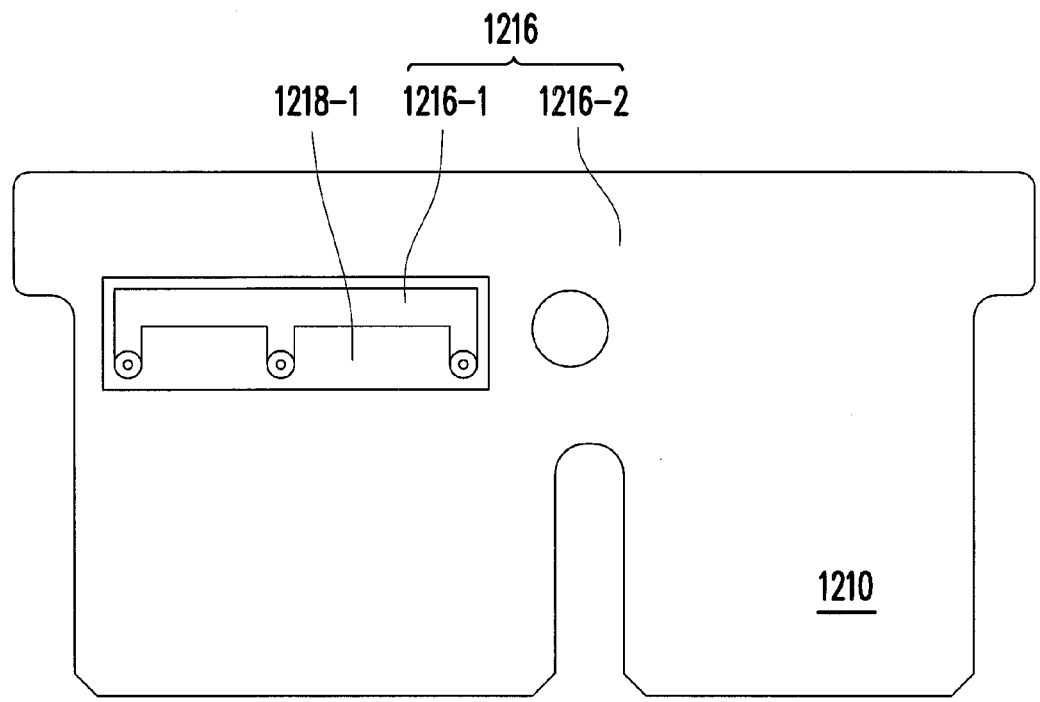
Figure 5E:
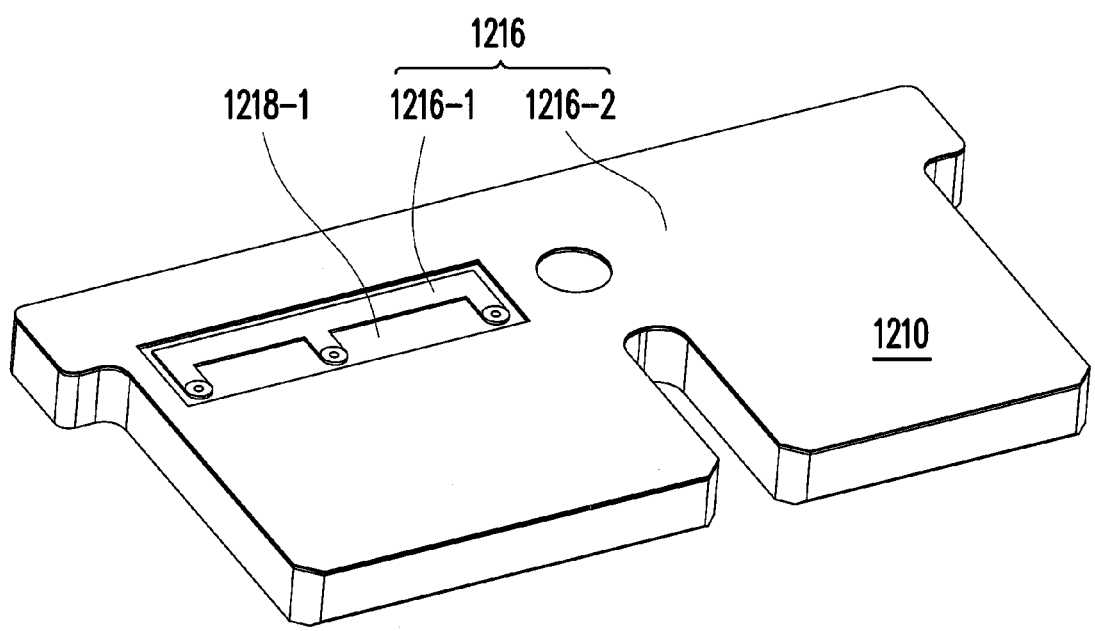

The design of FIG. 5D can be further modified to FIG. 5E where the contacting-end pattern portions 1212b to be electrically connected are electrically connected through the present ground layer 1216. In more details, referring to FIG. 5E, which is a 3-dimensional diagram of the printed circuit board viewed from the ground layer side and a top-view thereof, the surface insulation layer overlaying the ground layer 1216 is omitted for conveniently understanding the whole ground layer 1216. After patterning the ground layer 1216, the whole ground layer 1216 can be roughly divided into an element 1216-1 for the contacting-end pattern portions 1212b to be electrically connected to and an element 1216-2 for providing the electromagnetic shielding, and the two elements 1216-1 and 1216-2 are insulated from each other. To achieve the insulation, for example, the patterns of the two elements are independently from each other. In order to ensure the insulation from one another, a supplement insulation layer 1218-1 can be used to fill the space between the electrical connection element 1216-1 and the electromagnetic shielding element 1216-2, wherein the electrical connection element 1216-1 is electrically connected to those contacting-end pattern portions 1212b (to be electrically connected) through the inner conductive trace layer 1214b, which is similar to the design of FIG. 5D.

Figure 5F:
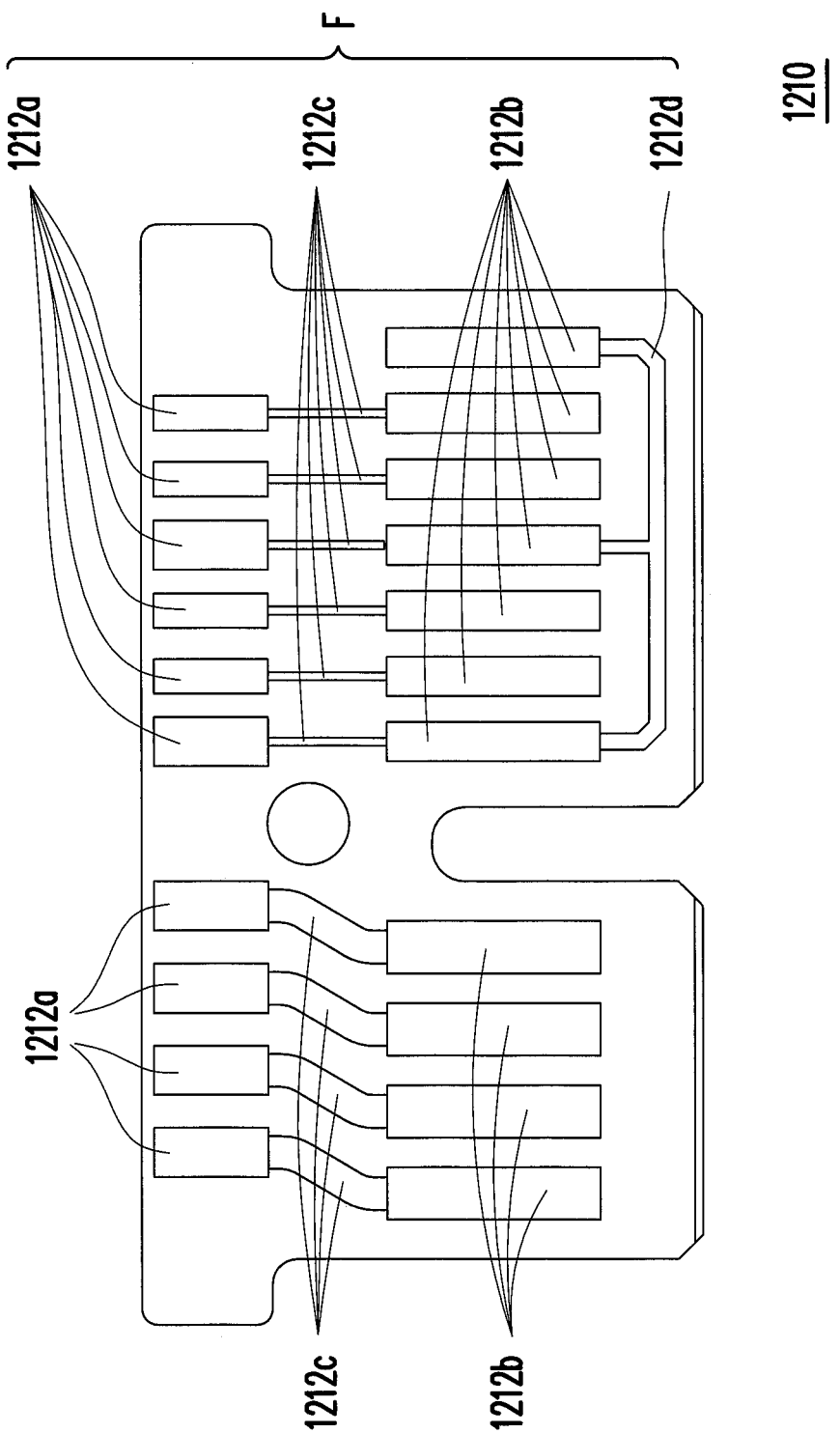

In addition, the contacting-end pattern portions (to be electrically connected) can be also electrically connected at the surface conductive trace layer side; that is to say that the connection wires 1212d between some of the contacting-end pattern portions 1212b are defined along with directly defining the conductive trace pattern F, as shown by FIG. 5F (a top-view of the printed circuit board viewed from the contacting-end pattern portions side).

Board-Side Connector

Figure 3:
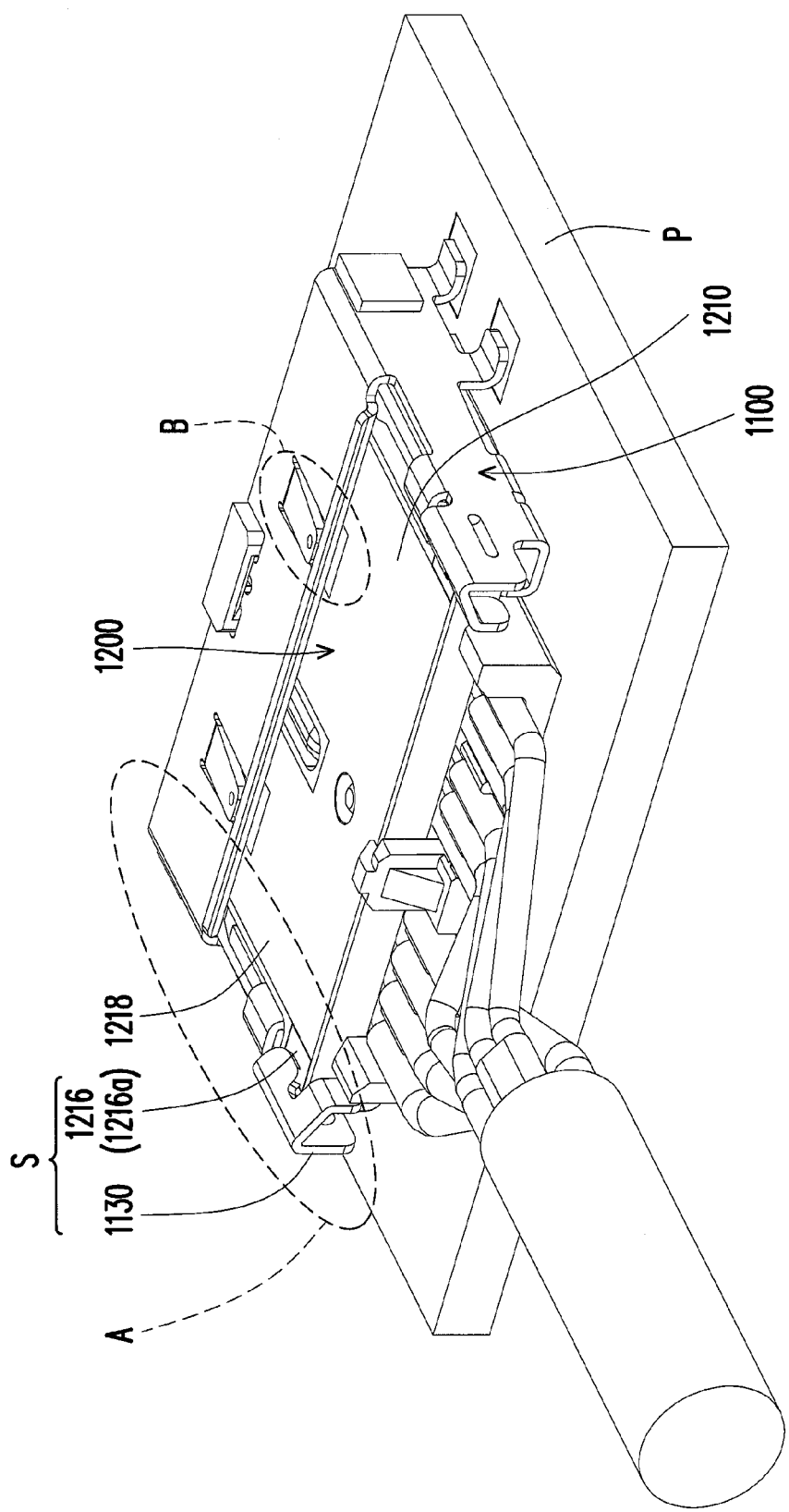
FIG. 3 is a perspective view of the connector assembly of FIG. 1 after assembling.
Figure 4A:
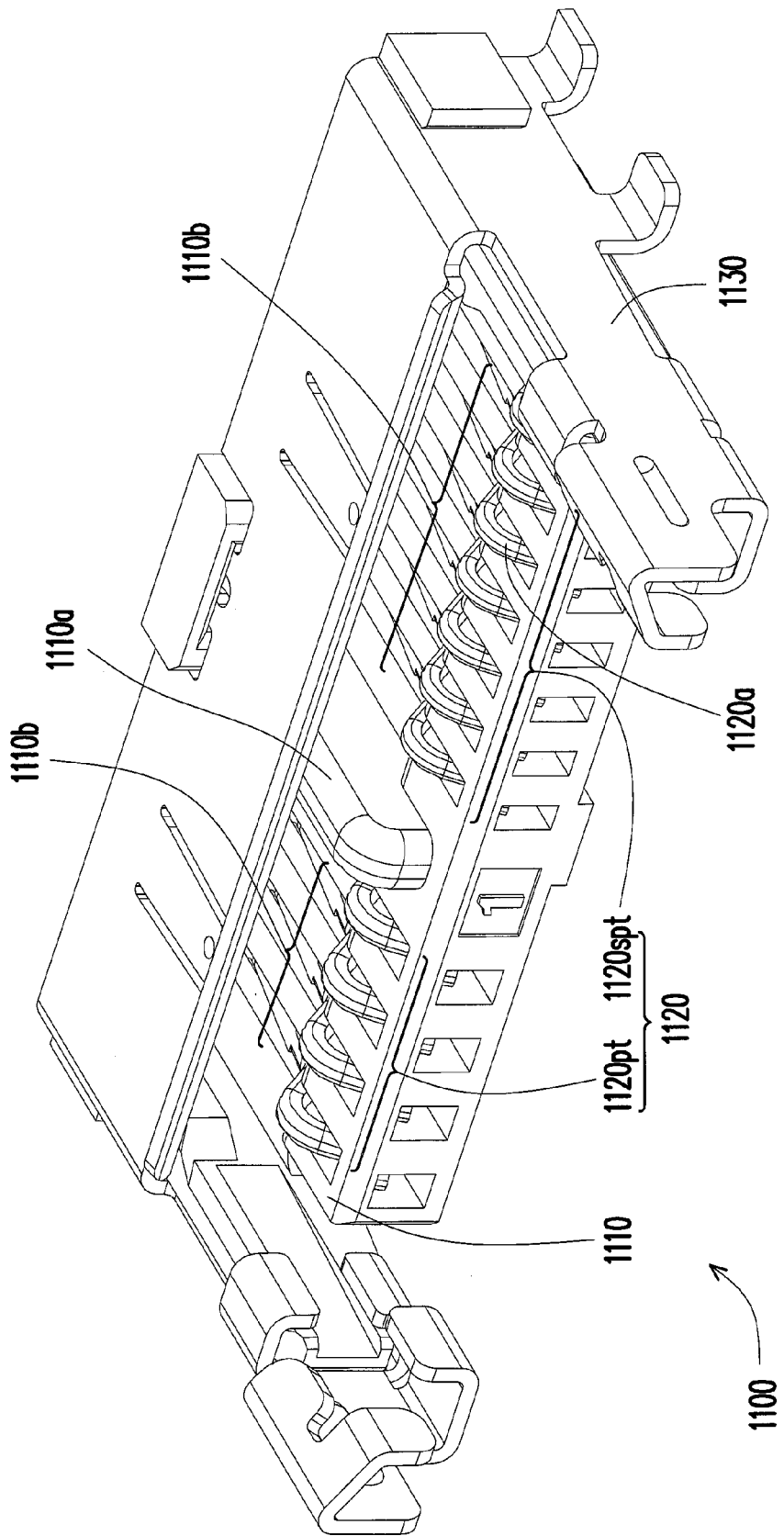
FIG. 4A is a perspective exploded schematic diagram of the board-side connector of FIG. 3.
Figure 4B:
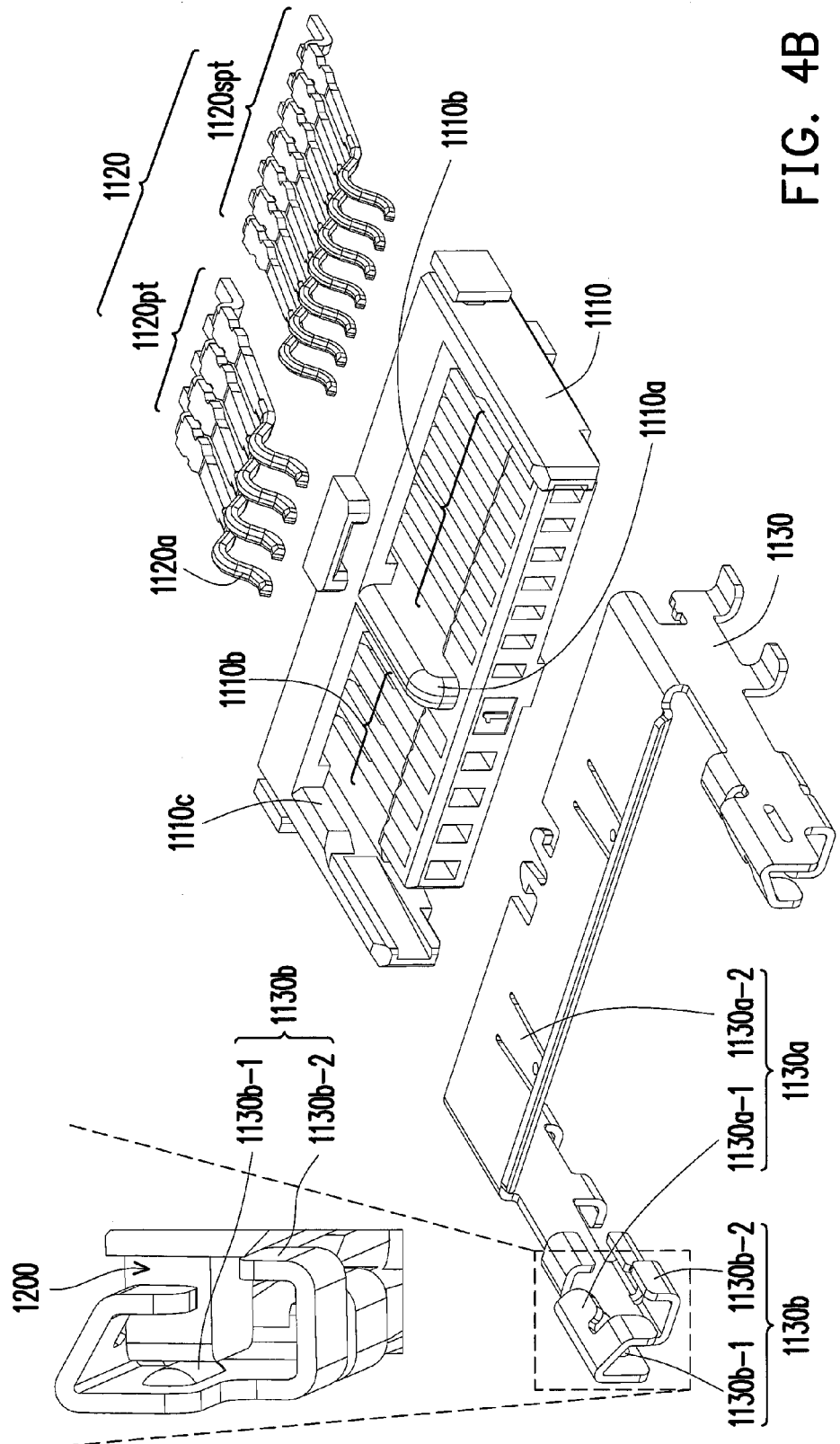
FIG. 4B is a perspective exploded schematic diagram of the board-side connector of FIG. 4A.

Referring to FIGS. 4A and 4B, the board-side connector 1100 is suitable to connect a cable-side connector 1200 (shown by FIG. 3). The board-side connector 1100 includes an insulation base 1110, a plurality of first cables 1120 and a shielding shell 1130.

The insulation base 1110 has a foolproof structure 1110a and a plurality of slots 1110b, in which the slots 1110b are disposed, for example, at both sides of the foolproof structure 1110a. The first cables 1120 are respectively inserted into the slots 1110b and each of the first cables 1120 has a protrusive portion 1120a protruded from the slots 1110b. Each of the slots 1110b has a higher plane at the place close to the protrusive portion 1120a. By means of disposing the foolproof structure 1110a, the first terminals 1120 are also respectively located at both sides of the foolproof structure 1110a.

The shielding shell 1130 encloses a part of the insulation base 1110 and exposes out the protrusive portions 1120a of the first terminals 1120 and the portions of the slots 1110b close to the protrusive portions 1120a. The protrusive portions 1120a of the first terminals 1120 and the shielding shell 1130 together form an obliquely guiding path 1100a (shown by FIG. 2). The obliquely guiding path 1100a can be used for the cable-side connector 1200 to be obliquely inserted to the board-side connector 1100. The shielding shell 1130 further includes at least one electrical leaning portion 1130a and at least one structure position-limitation portion 1130b.

Referring to FIG. 4B, the insulation base 1110 has two extension arms 1110c at both sides thereof and the extension arms 1110c are connected to the shielding shell 1130. During assembling or detaching the cable-side connector 1200, the extension arms 1110c at both sides of the insulation base 1110 would produce stress variation thereof. For making the withstood stress more uniform, the thickness of the extension arm 1110c is gradually changed, for example, the extension arm 1110c is a slope structure or other curved surface structures.

In the examples of the printed circuit board of the cable-side connector in FIGS. 5C-5F, the printed circuit board can have flanges 1210b located at both sides of the printed circuit board 1210. The ground layer 1216 of the printed circuit board 1210 further extends onto the flanges 1210b, and the surface insulation layer 1218 exposes a part 1216a of the ground layer 1216 located on the flanges 1210b. The exposed ground layer 1216a is positioned correspondingly to electrical leaning portions 1130a (1130a-1 and 1130a-2) of the shielding shell 1130 so that the ground layer 1216 is contacted the electrical leaning portions 1130a through the exposed part 1216a to form the electromagnetic shielding structure S.

Figure 6B:
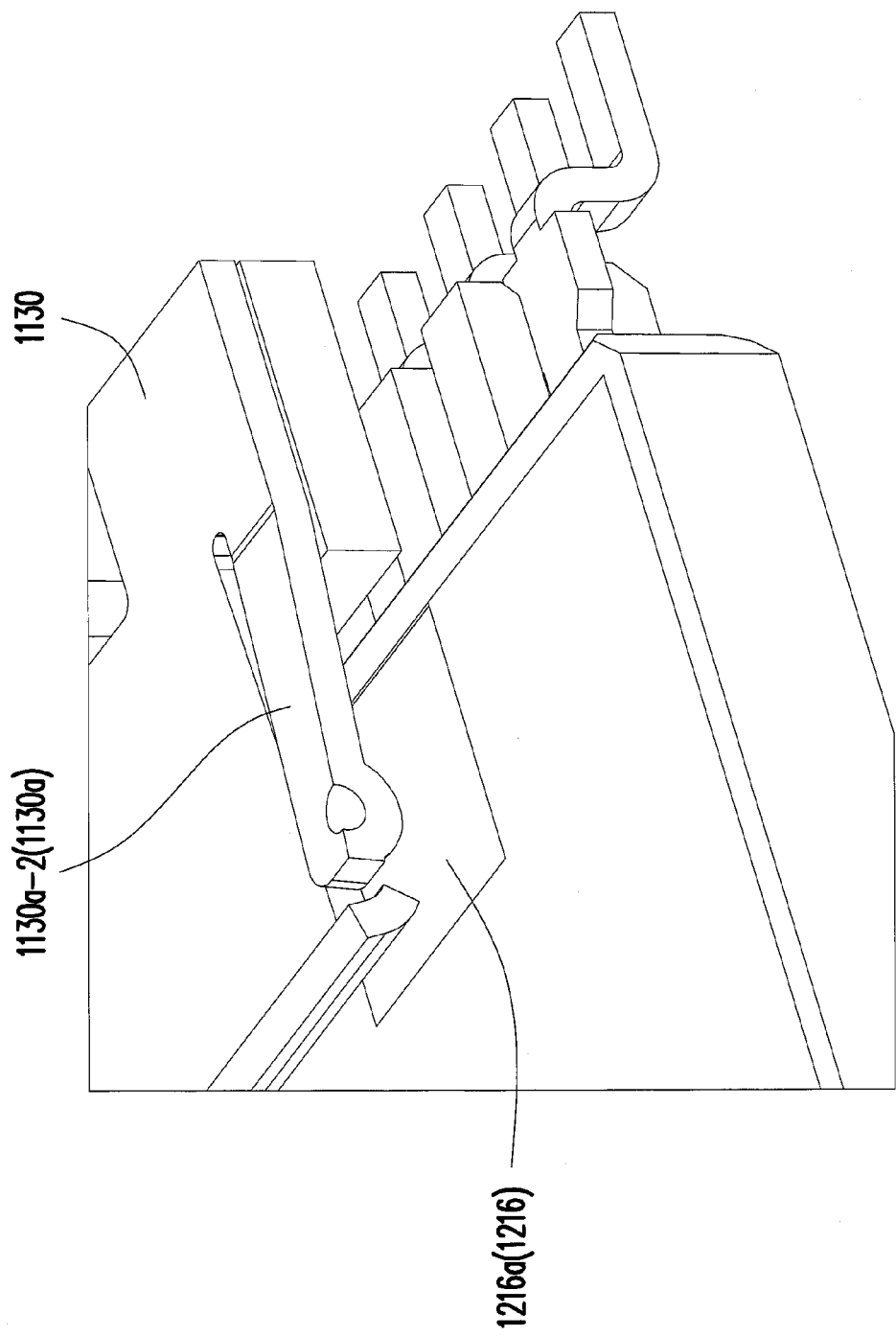
FIG. 6B is a partially enlarged perspective view corresponding to part B of FIG. 3.

Referring to FIGS. 3, 6A and 6B, the electrical leaning portions 1130a are located at least one location of both sides and the upper side of the shielding shell 1130 and correspondingly to the exposed part 1216a of the ground layer 1216 of the cable-side connector 1200. The electrical leaning portions 1130a include a portion (for example, 1130a-1) formed by bending a part of the shielding shell 1130 and an elastic plate (for example, 1130a-2) formed by a part of the shielding shell 1130. For example, the 1130a-1 of the electrical leaning portions 1130a is formed by bending a part of the shielding shell 1130 and making the part downwards towards the part 1216a in the ground portion 1216 of the cable-side connector 1200, and the electrical leaning portion 1130a-1 is located at both sides of the shielding shell 1130. When the electrical leaning portion 1130a-1 is contacted the part 1126a in the ground portion 1126, the upper motion of the cable-side connector 1200 is limited. In other words, the electrical leaning portion 1130a-1 can be used for both electrical leaning (i.e., electrical contacting) and structure position-limitation (limiting the upper motion of the cable-side connector 1200). Since the electrical leaning portion 1130a-1 functions also as an upper position-limitation portion, it has a moderated slope S1 towards the ground portion 1216a. When the cable-side connector 1200 is assembled to or detached from the board-side connector 1100, the user can use the slope S1 as an operation interface to conduct the assembling/detaching connector job. By using the slope S1, the user can be avoided from injuring and operation inconvenience, so that the design is referred as a user-friendly structure. In addition, the electrical leaning portions 1130a can be a metallic protrusive point, a metallic protrusive line or a metallic protrusive surface.

Figure 6C:
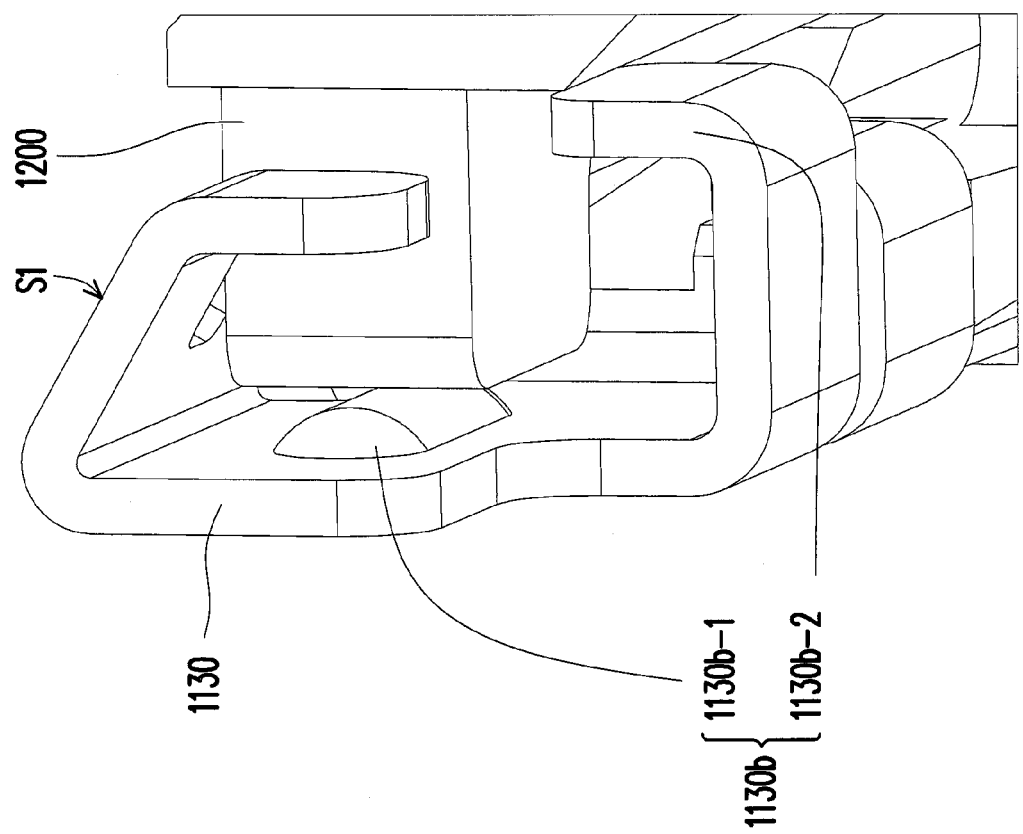
FIG. 6C is a perspective view of FIG. 6A in another angle of viewing.

Referring to FIGS. 6A and 6C, the structure position-limitation portion 1130b can include a lower position-limitation portion 1130b-2 which is formed by upwards bending a part of the shielding shell 1130 for limiting the lower motion of the cable-side connector 1200. In addition, an inward protrusive portion 1130b-1 of the structure position-limitation portion 1130b is inwards protruded from a part of the shielding shell 1130 for limiting the left and right motions of the cable-side connector 1200, by which the connector can be prevented from over-pressing.

Figure 6D:
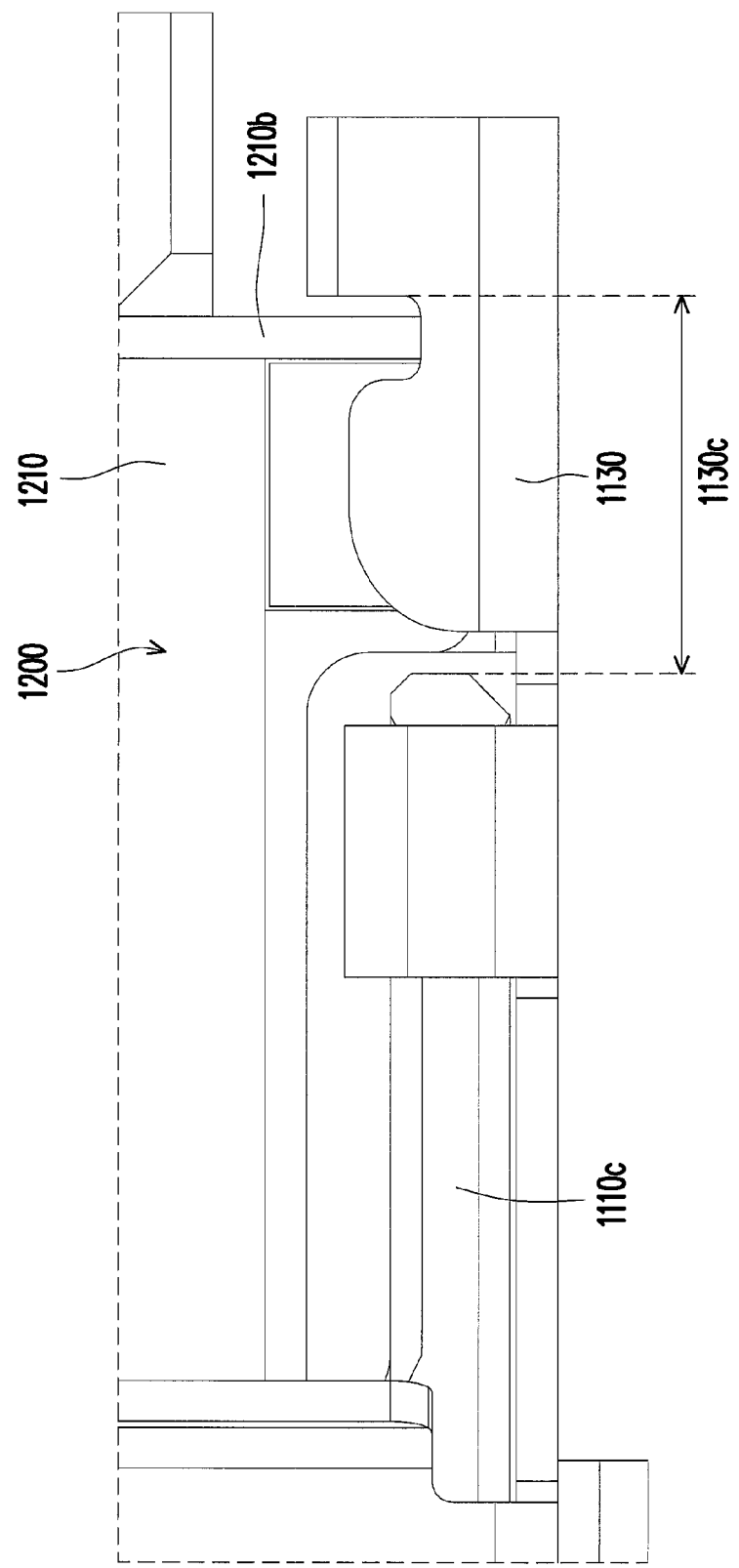
FIG. 6D is a partial top-view diagram corresponding to part A of FIG. 3.

Referring to FIGS. 3, 6A and 6D, the shielding shell 1130 further has a forward-backward position-limitation portion 1130c located at both sides of the shielding shell 1130 and formed by bending a part of the shielding shell 1130. The flanges 1210b of the printed circuit board 1210 are accommodated in the forward-backward position-limitation portion 1130c, by which the forward and backward motions of the cable-side connector 1200 are limited. In FIG. 6D, the forward-backward position-limitation portion 1130c is formed by the side walls of the extension arms 1110c of the insulation base 1110 and the bent portion of the shielding shell 1130. However, the bent shielding shell 1130 can also alone form a position-limitation space to accept the flanges of the printed circuit board therein.

Figure 7A:
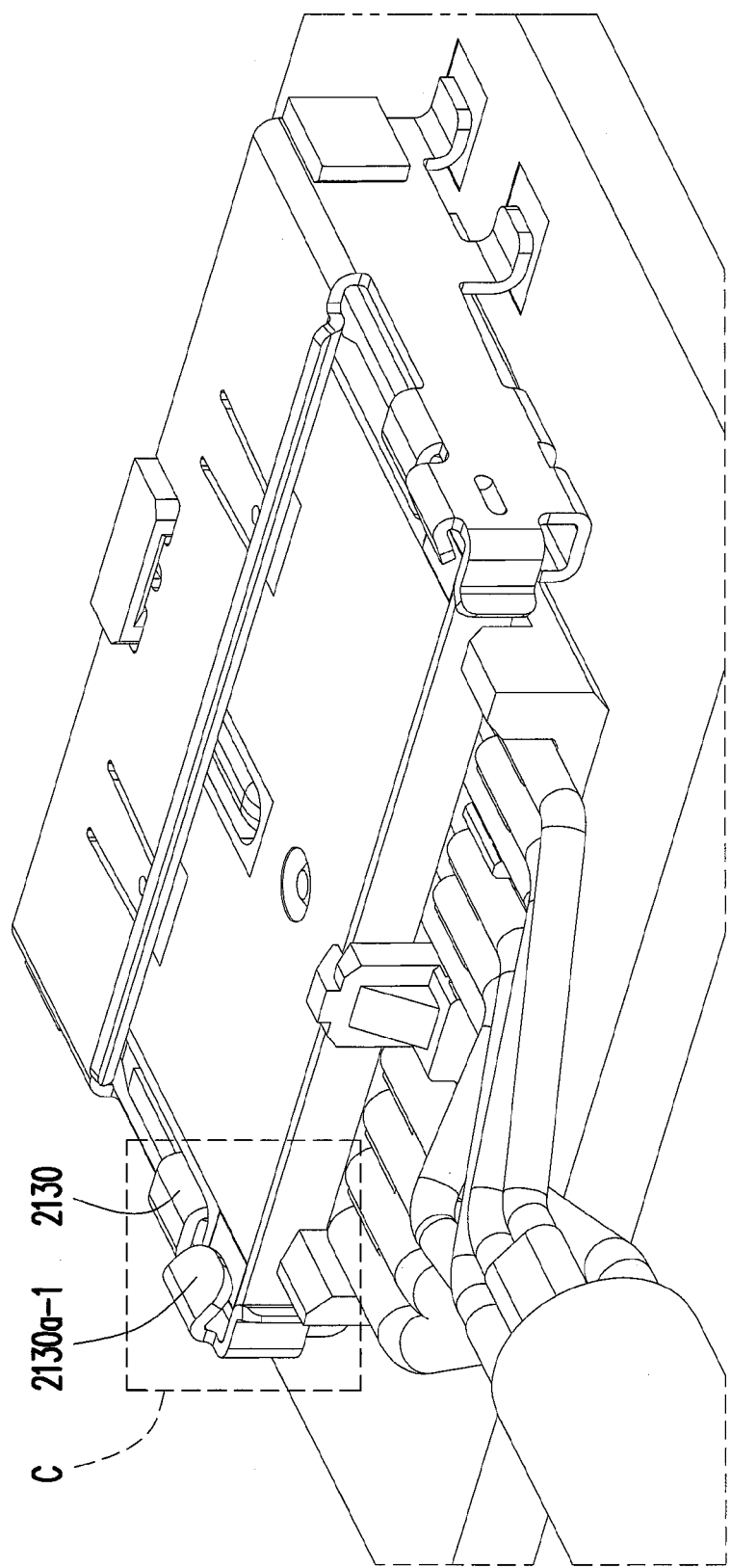
FIG. 7A is a perspective view of a shielding shell according to a second embodiment of the invention.
Figure 7B:
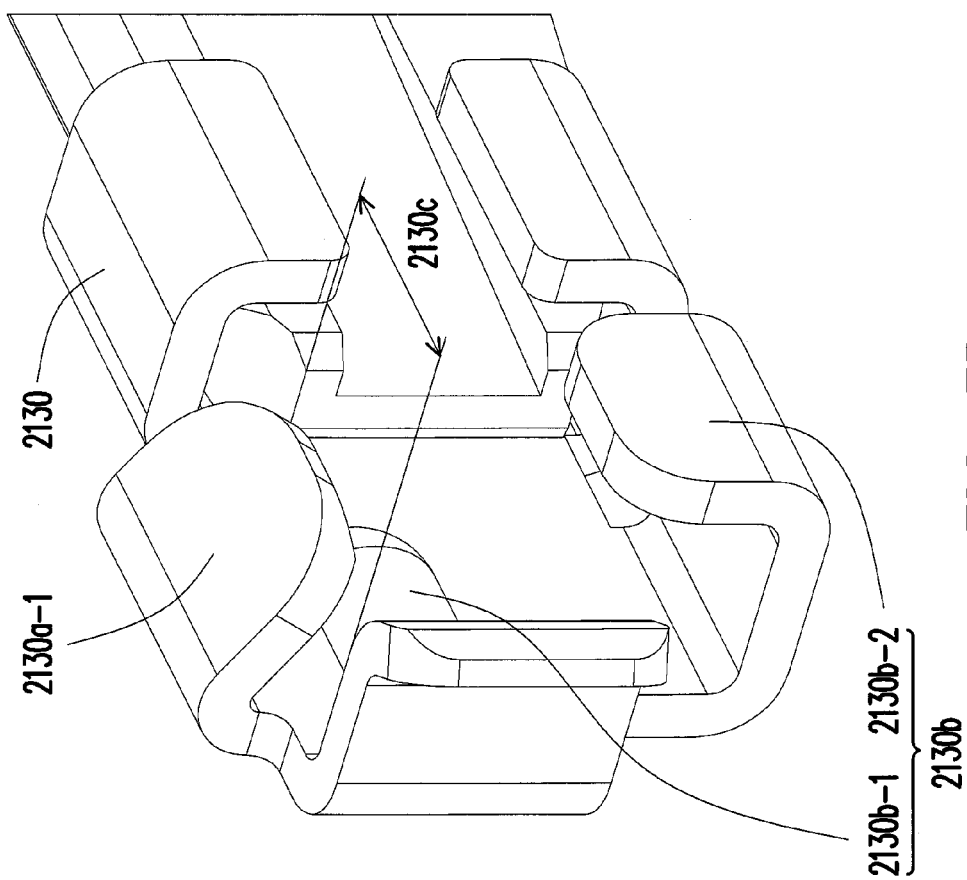
FIG. 7B is a partially enlarged perspective view corresponding to part C of FIG. 7A.

In the second embodiment of the invention, a shielding shell 2130 is disclosed as shown by FIGS. 7A and 7B. Referring to FIGS. 7A and 7B, for simplicity, the printed circuit board and the cables are omitted in FIG. 7B. An electrical leaning portion 2130a-1 and four portions of an upper position-limitation portion 2130a-1, an inward protrusive portion 1130b-1, a lower position-limitation portion 2130b-2 and a forward-backward position-limitation portion 2130c of a structure position-limitation portion 2130b are formed by bending parts of the shielding shell 2130 and located at both sides of the shielding shell 2130. The difference of the upper position-limitation portion 2130a-1 of the shielding shell 2130 in the embodiment from the upper position-limitation portion 1130a-1 of the shielding shell 1130 in FIG. 6A rests in that the moderated slope S1 of the upper position-limitation portion 1130a-1 in FIG. 6A can further sideward extend to the forward-backward position-limitation portion so that the area of the slope S1 gets larger.

Figure 8A:
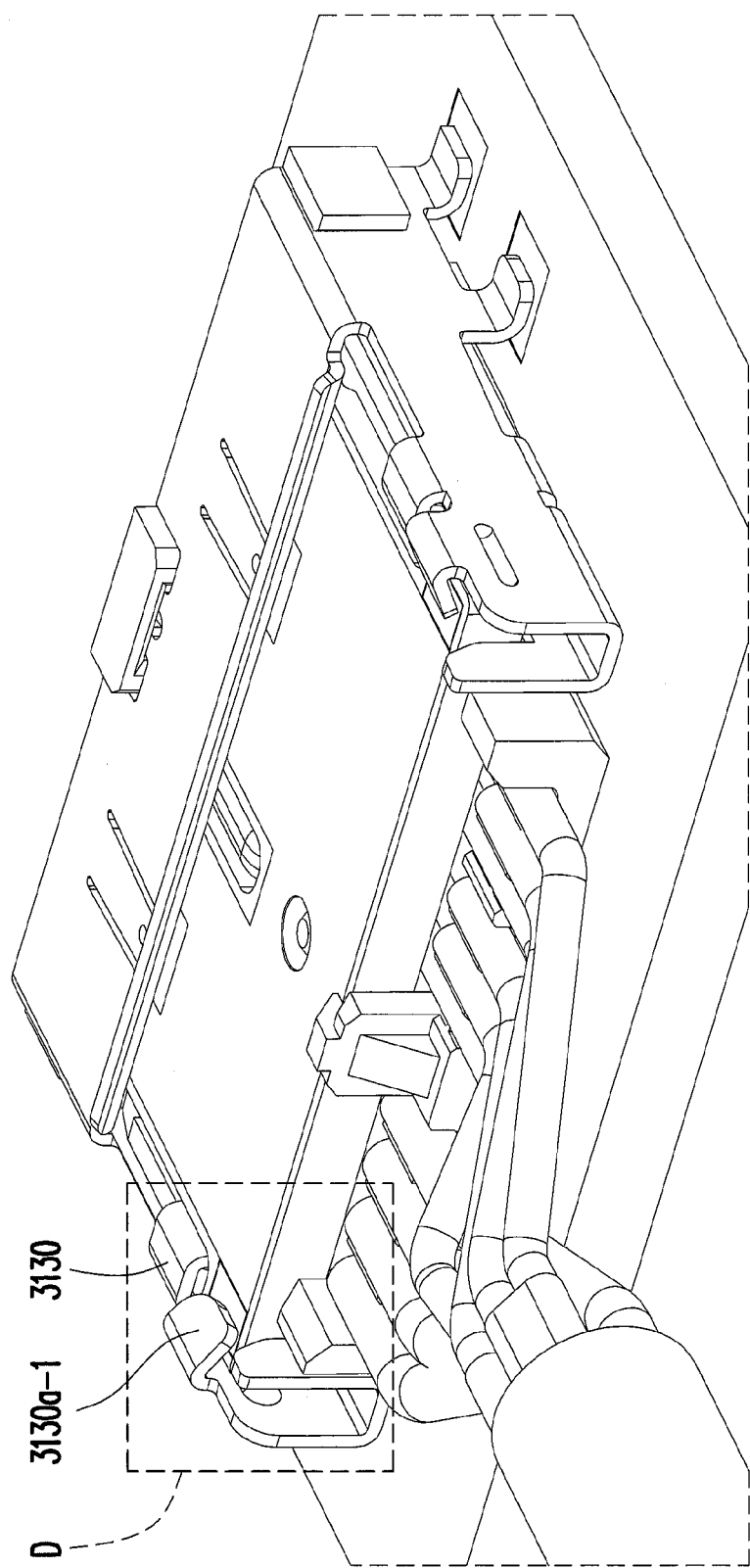
FIG. 8A is a perspective view of a shielding shell according to a third embodiment of the invention
Figure 8B:
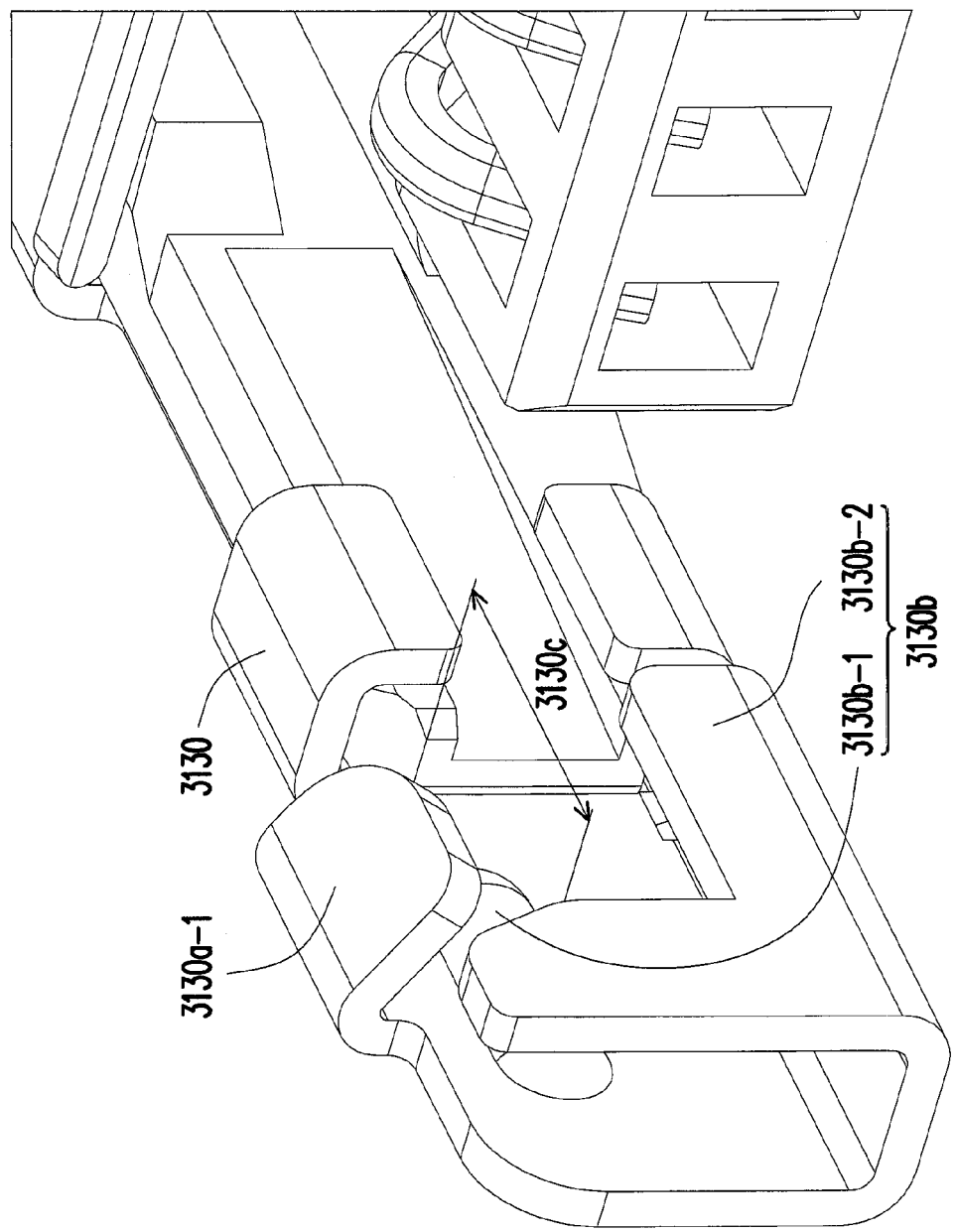
FIG. 8B is a partially enlarged perspective view corresponding to part D of FIG. 8A.

A shielding shell 3130 in a third embodiment of the invention is disclosed as shown in FIGS. 8A and 8B. Referring to FIGS. 8A and 8B, for simplicity, the printed circuit board and the cables are omitted in FIG. 8B. The difference of the upper position-limitation portion 3130a-1 of the shielding shell 3130 in the embodiment from the upper position-limitation portion 1130a-1 of the shielding shell 1130 in FIG. 6A rests in that the moderated slope S1 of the upper position-limitation portion 1130a-1 in FIG. 6A can further sideward extend to the forward-backward position-limitation portion so that the area of the slope S1 gets larger. In addition, the lower position-limitation portion 3130b-2 of the embodiment can further extend to connect the forward-backward position-limitation portion 3130c and substantially is in L-shape.

Figure 9:
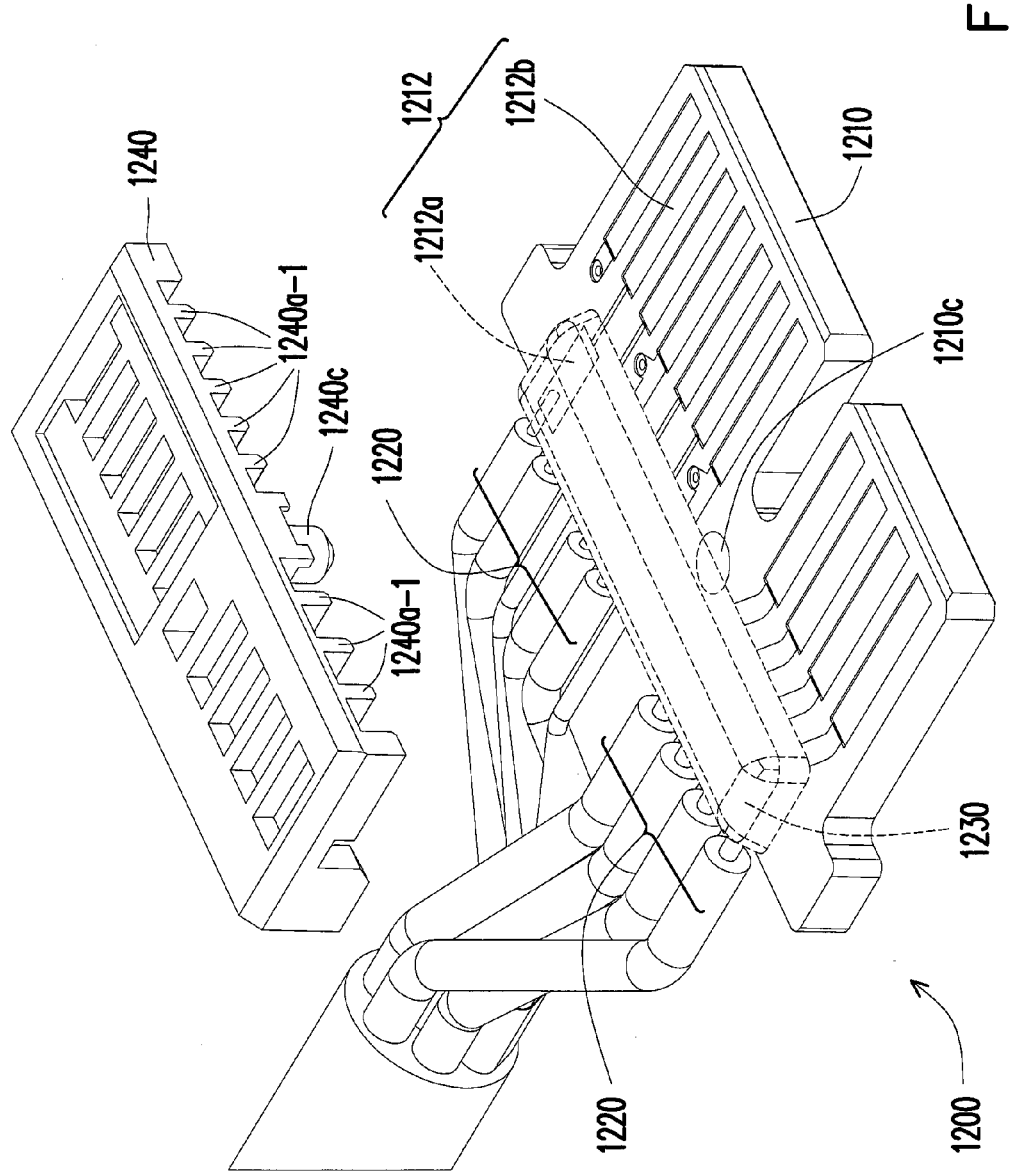
FIG. 9 is a schematic diagram showing an insulation cover of the first embodiment of the invention is assembled to the cable-side connector.

Referring to FIG. 9, for strengthening the connection between the cables 1220 and the surface conductive trace layer 1212, the cable-side connector 1200 further includes a protective glue 1230 overlaying a part of the cables 1220 and the bonding pad portions 1212a so as to protect the connection between the cables 1220 and the surface conductive trace layer 1212. For simplicity, the protective glue 1230 is represented with dashed line, and the bonding pad portions 1212a are shown with a single one and dashed line. The protective glue 1230 in the embodiment is, for example, a UV glue, and after irradiation by ultraviolet, the UV glue is cured so as to achieve protection and strengthening effect. Any materials with insulation and curable property can serve as the protective glue.

Figure 10:
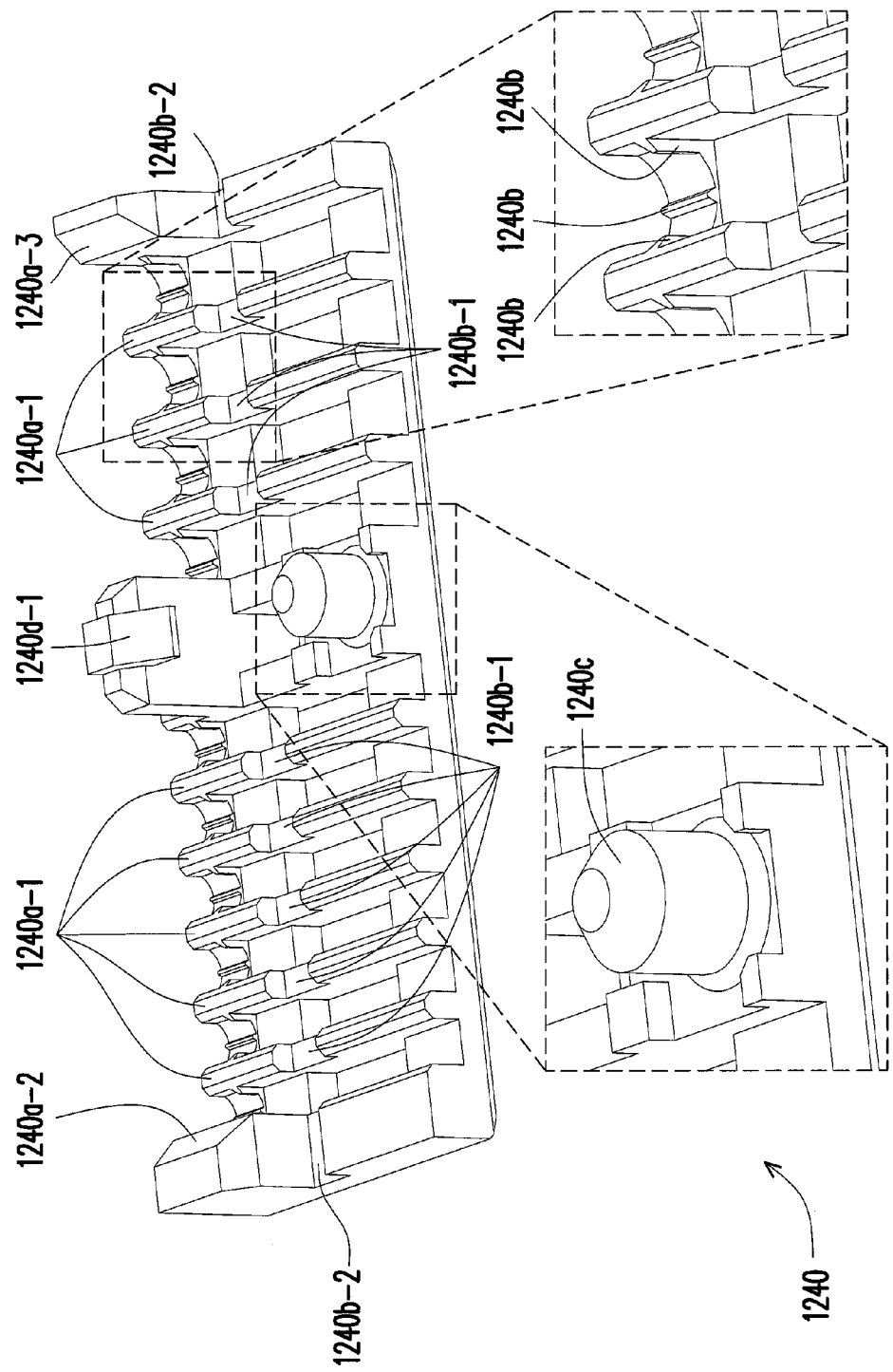
FIG. 10 is a perspective view of the shielding shell of the cable-side connector in FIG. 9 in another angle of viewing.

Referring to FIGS. 9 and 10, in order to further protect and strengthen the cables 1220 and the surface conductive trace layer 1212, the cable-side connector 1200 can include an insulation cover 1240 overlaying a place around the connection between the cables 1220 and the surface conductive trace layer 1212. The insulation cover 1240 has a plurality of lengthwise walls 1240a-1, 1240a-2 and 1240a-3 disposed correspondingly to the figure of the cables 1220. By means of the combination of the lengthwise walls 1240a of the insulation cover 1240 and the printed circuit board 1210, the cables 1220 can be partitioned and clamped. In addition, the lengthwise walls 1240a-1, 1240a-2 and 1240a-3 respectively have at least one protrusive rib 1240b disposed at a side surface thereof so as to better clamp the cables 1220.

The insulation cover 1240 and the printed circuit board 1210 are assembled together in fastening way. For example, the insulation cover 1240 further has a first positioning portion 1240c and a first fastening portion 1240d-1. The printed circuit board 1210 further has a second positioning portion 1210c. The first positioning portion 1240c of the insulation cover 1240 and the second positioning portion 1210c of the printed circuit board 1210 are positioned by inserting each other, and the first fastening portion 1240d-1 of the insulation cover 1240 is fastened at the printed circuit board 1210. When the first positioning portion 1240c of the insulation cover 1240 is a protrusive pillar, the second positioning portion 1210c of the printed circuit board 1210 is a through hole. The lengthwise walls 1240a-1, 1240a-2 and 1240a-3 of the insulation cover 1240 respectively have a transverse groove 1240b-1 or 1240b-2 and the transverse grooves 1240b-1 and 1240b-2 function as accommodation spaces of the protective glue 1230. When the insulation cover 1240 is assembled to the printed circuit board 1210, the transverse grooves 1240b-1 and 1240b-2 can protect and accommodate the protective glue 1230.

Referring to FIGS. 4A and 5B, the printed circuit board 1210 of the cable-side connector 1200 has a foolproof structure 1210a which includes a lengthwise rib or a lengthwise recess. When the cable-side connector 1200 is assembled to the board-side connector 1100, the foolproof structure 1210a of the cable-side connector 1200 and the foolproof structure 1110a of the board-side connector 1100 are also assembled by each other, in which the foolproof structure 1110a of the board-side connector 1100 includes a lengthwise rib or a lengthwise recess as well.

The electronic signals transmission content between the motherboard P and other electronic apparatuses is roughly divided into power, low-speed signal and high-speed signal. In order to obtain the most broad applications, the terminals of the board-side connector 1100 and the contacting-end pattern portions (golden fingers) of the cable-side connector 1200 should be designed by referring to several common pin specifications and used in general way to as many specifications as possible, so that the cables 1220 of the cable-side connector 1200 become common cables compatible with many specifications, in which as long as the number of terminals of the board-side connector 1100, the number of golden finger of the cable-side connector 1200 (i.e., the number of the first terminals 1120 and the number of the contacting-end pattern portions 1212*b*) and the number of the cables 1220 are respectively greater than the number of terminals of the electronic apparatus to be connected, the above-mentioned usage in general way can be achieved through appropriate wiring (for example, by connecting the cable/cables of a terminal/terminals coupled to other apparatus).

Referring to FIGS. 4A and 5B, the first terminals 1120 of the board-side connector 1100 include at least one power/low-speed signal terminal 1120*pt* and at least one high-speed terminal 1120*spt*. It should be noted that '/' herein represents 'sharing'. For example, power/low-speed signal terminals 1120*pt* indicate the terminals can serve both for transmitting power and for transmitting low-speed signal. The contacting-end pattern portions 1212*b* of the cable-side connector 1200 include at least one power/low-speed signal contacting-end pattern 1212 bpt and at least one high-speed signal contacting-end pattern 1212*spt*. The pin definitions of the power/low-speed terminals 1120*pt* of the first terminals 1120 and the power/low-speed signal contacting-end patterns 1212 bpt of the contacting-end pattern portions 1212*b* include all pin definitions of USB2.0, pin definition of SATA power terminal or pin definition of eSATA power terminal. The pin definitions of the high-speed terminals 1120*spt* of the first terminals 1120 and the pin definitions of the high-speed signal contacting-end patterns 1212*bspt* of the contacting-end pattern portions 1212*b* include pin definitions of signal terminals of SATA, USB3.0 or eSATA.

In FIG. 5B, portions of the cables 1220 corresponding to the high-speed signal contacting-end patterns 1212*bspt* are a set of differential-signal wires integrated by a pair of positive-phase signal wire and negative-phase signal wire and a ground wire. In addition, the cables 1220 can include single-core wire or multi-cores wire and can be configured depending on the design requirement.

The foolproof structure 1110*a* of the board-side connector 1100 partitions the power/low-speed signal terminals 1120*pt* from the high-speed terminals 1120*spt*. The foolproof structure 1210*a* of the cable-side connector 1200 partitions the power/low-speed signal contacting-end patterns 1212 bpt from the high-speed signal contacting-end patterns 1212*bspt*.

In the invention, considering that a power transmission preferably adopts wide path, so that an interval between the power/low-speed signal terminals 1120*pt* of the first terminals 1120 is greater than an interval between the high-speed signal terminals 1120*spt*. Certainly, a width of each of the power/low-speed signal terminals 1120*pt* of the first terminals 1120 can be greater than a width of each of the high-speed signal terminals 1120*spt* as well. In addition, an interval between the power/low-speed signal contacting-end patterns 1212*pt* of the contacting-end pattern portions 1212*b* is greater than an interval between the high-speed signal contacting-end patterns 1212*spt*. Certainly, a width of each of the power/low-speed signal contacting-end patterns 1212*pt* of the contacting-end pattern portions 1212*b* can be greater than a width of each of the high-speed signal contacting-end patterns 1212*spt* as well.

Figure 11A:
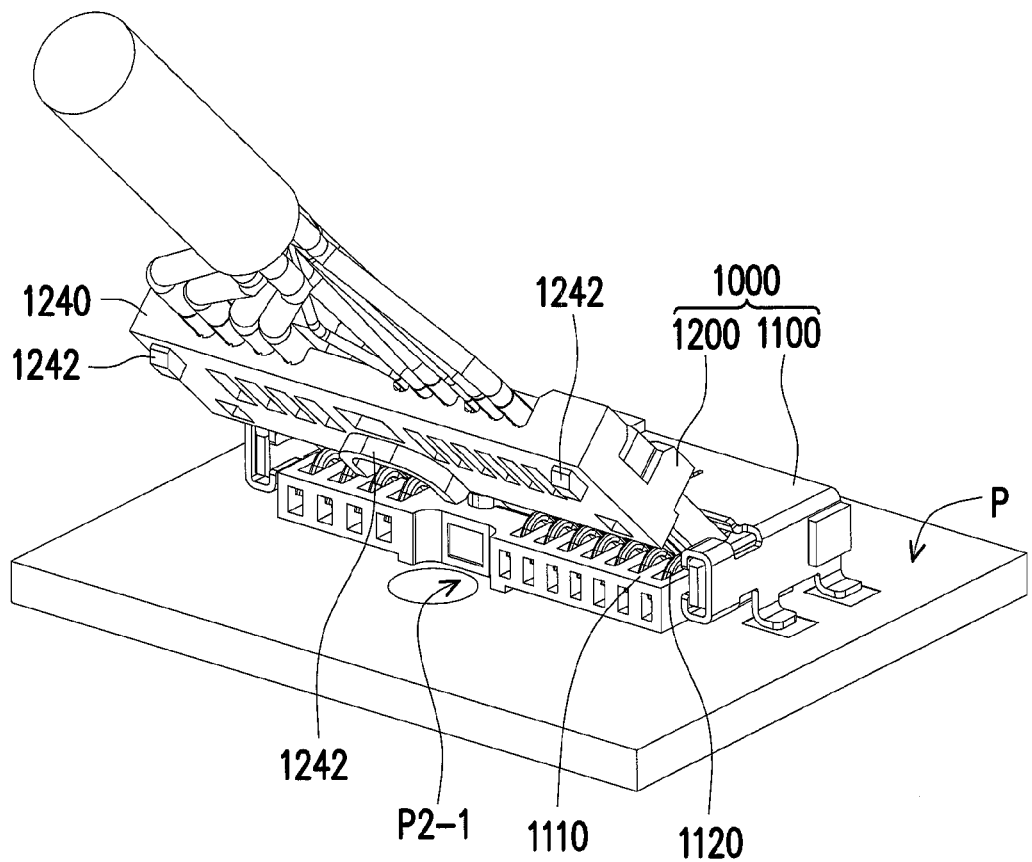
FIGS. 11A-11C are schematic diagrams showing assembling a connector assembly according to a fourth embodiment of the invention.
Figure 11B:
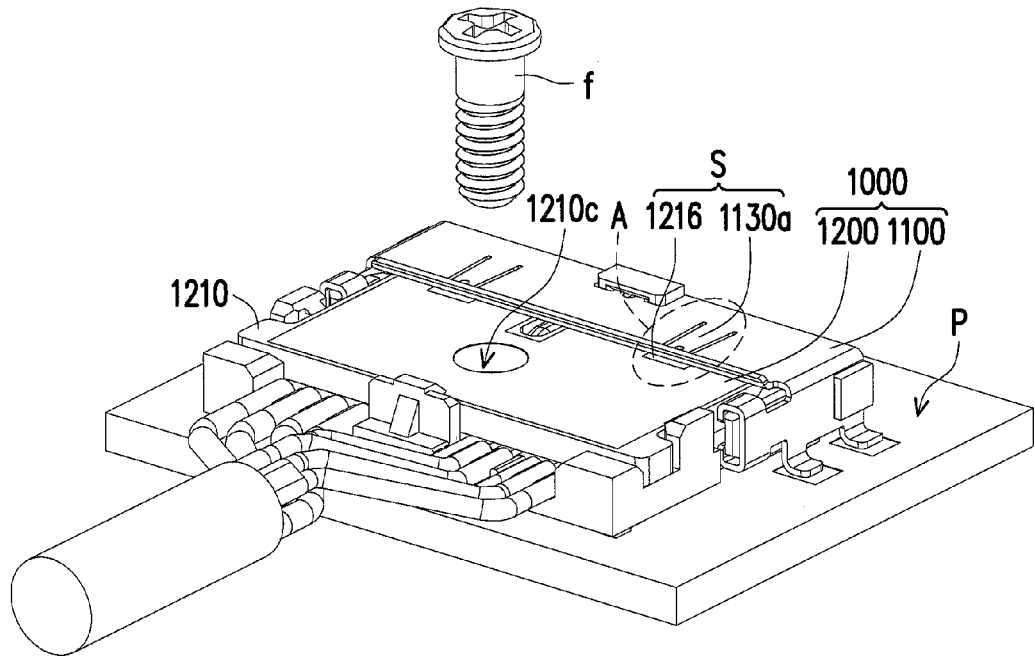
Figure 11C:
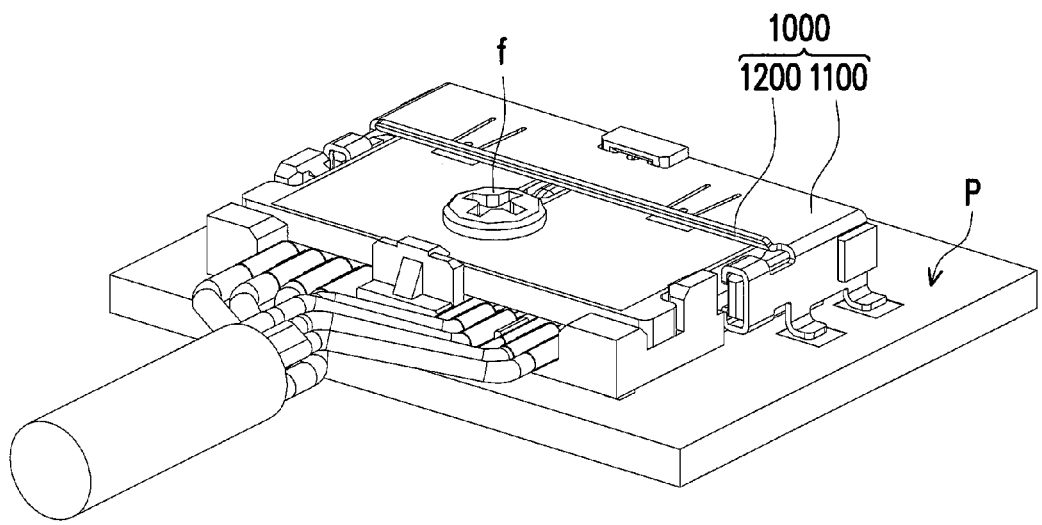
Figure 12:
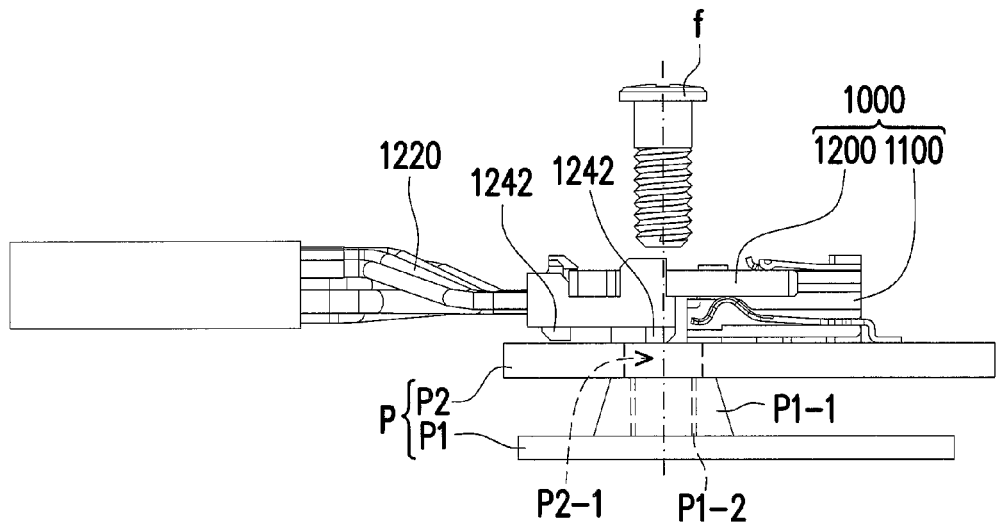
FIG. 12 is a cross-sectional diagram of the connector assembly of FIG. 11B.

In the fourth embodiment of the invention, a connector assembly 1000 is disclosed as shown by FIGS. 11A-11C. Referring to FIGS. 11A-11C, the connector assembly 1000 includes a board-side connector 1100 and a cable-side connector 1200. The board-side connector 1100 has an insulation base 1110 and a plurality of first terminals 1120 carried by the insulation base 1110, in which the cable-side connector 1200 is electrically connected to the board-side connector 1100. The board-side connector 1100 and the cable-side connector 1200 are suitable to be fixed to a motherboard P through a holding part f. In FIGS. 11A-11C, a second aligning portion 1210*c* of a printed circuit board 1210 is designed as a positioning hole and the role of the first positioning portion of the insulation cover 1240 in the embodiment is replaced by the holding part f, and instead, a first leaning portion 1241 and a leaning portion 1242 are added. In more details, the insulation cover 1240 of the cable-side connector 1200 has a leaning portion 1242. When an assembling worker places the cable-side connector 1200 on the board-side connector 1100, the leaning portion 1242 is contacted the motherboard P (as shown by FIG. 12), and the holding part f goes through the second positioning portion 1210*c* (aligning hole) of the printed circuit board 1210 of the cable-side connector 1200 and is fixed to the motherboard P. In this way, the structure around the connection between the board-side connector 1100 and the cable-side connector 1200 is simplified, the number of connection parts of the connector assembly 1000 is cut down and the production cost is reduced.

Referring to FIG. 12, the motherboard P in the fourth embodiment includes a case main board P1 and a circuit main board P2. The case main board P1 is located at one side of the cable-side connector 1200 and the cable-side connector 1200 is contacted the circuit main board P2. The board-side connector 1100 is suitable to be fixed to the circuit main board P2, and the circuit main board P2 is, for example, a motherboard or a main board of control circuit in a common electronic apparatus.

The case main board P1 can have a thread pillar P1-1 wherein the thread pillar has an inner thread. P1-2, and the circuit main board P2 has a through hole P2-1. When the leaning portion 1242 is contacted the circuit main board P2, the holding part f goes through the cable-side connector 1200, the board-side connector 1100 and the through hole P2-1 of the circuit main board P2 to be fastened into the inner thread P1-2 of the thread pillar P1-1 of the case main board P1, so that the board-side connector 1100, the cable-side connector 1200 and the motherboard P are fixed, in which the holding part f can be a screw.

Figure 13:
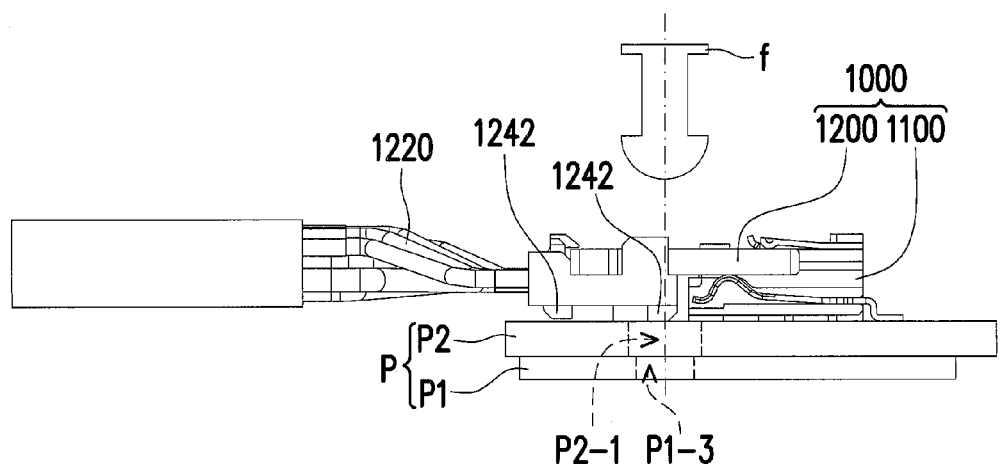
FIG. 13 is a cross-sectional diagram of a connector assembly according to a fifth embodiment of the invention.

Referring to FIG. 13, a case main board P1 in a fifth embodiment of the invention has an opening P1-3. When the leaning portion 1242 is contacted the circuit main board P2, the holding part f goes through the cable-side connector 1200, the board-side connector 1100 and the through hole P2-1 of the circuit main board P2 to be fastened into the opening P1-3 of the case main board P1, so that the board-side connector 1100, the cable-side connector 1200 and the motherboard P are fixed, in which the holding part f can be a plastic fastening part (for example, snap fastener). In another unshown embodiment, the holding part f can directly go through the cable-side connector 1200 to be fastened in the through hole P2-1 of the circuit main board P2. The user can make the holding part f fastened at the case main board P1 or the circuit main board P2 by adjustment according to the real requirement.

FIGS. 14A-15B illustrate other examples of the structures of the cable-side connector and the insulation cover.

Referring to FIGS. 14A-15B, the insulation cover 1240 has a first aligning portion 1241 and at least one leaning portion 1242. The leaning portion 1242 is contacted the motherboard P (as shown by FIG. 12), in which the holding part f goes through the second aligning portion 1210c (aligning hole) of the printed circuit board 1210, the first aligning portion 1241 of the insulation cover 1240 and the motherboard P so as to fix the cable-side connector 1200. The cables 1220 are located between the printed circuit board 1210 and the insulation cover 1240 and electrically connected to the conductive trace pattern F of the surface conductive trace layer 1212.

When an assembling worker assembles the cable-side connector 1200 to the board-side connector 1100, the holding part f makes the two connectors fixed to the motherboard P so as to advance assembling efficiency. In addition, the insulation cover 1240 has a leaning portion 1242 for supporting the connector assembly 1000 during assembling, which avoids the connector assembly 1000 or the motherboard P from damage due to over-pressing.

Figure 15A:
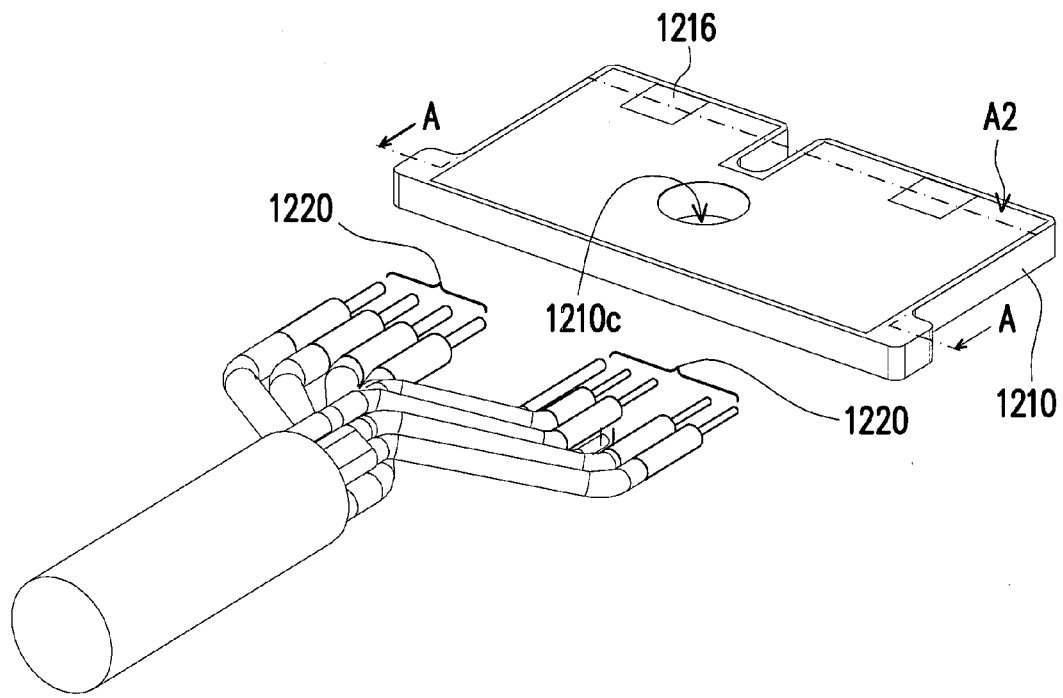
FIG. 15A is an exploded schematic diagram of the printed circuit board and the cables of FIG. 14A.
Figure 15B:
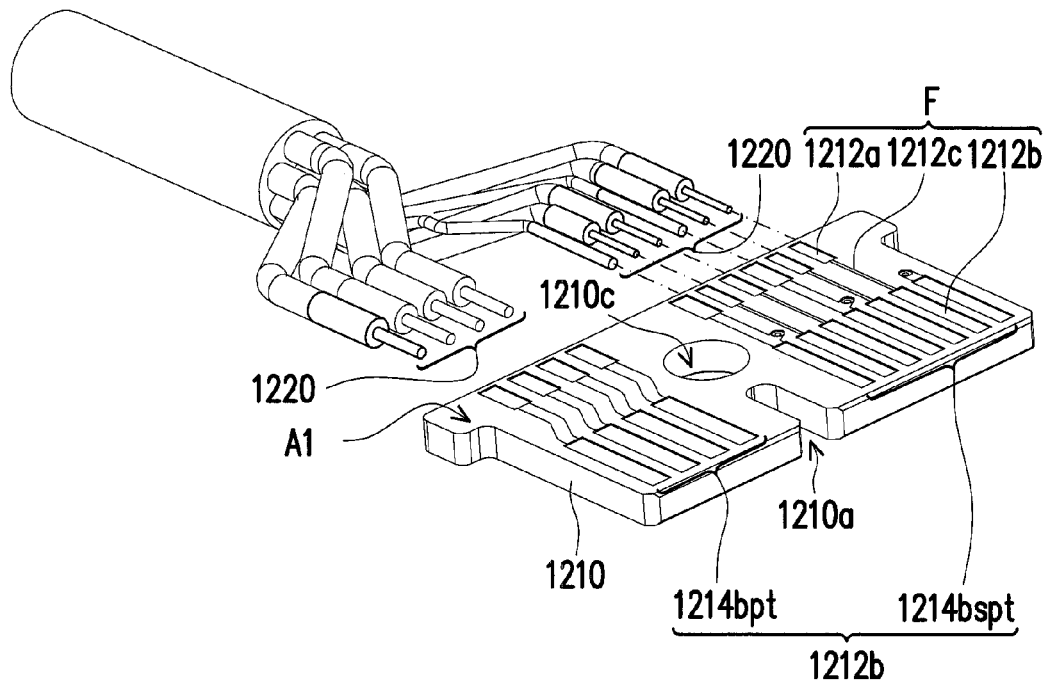
FIG. 15B is an exploded schematic diagram of the printed circuit board and the cables of FIG. 15A in another angle of viewing.
Figure 15C:
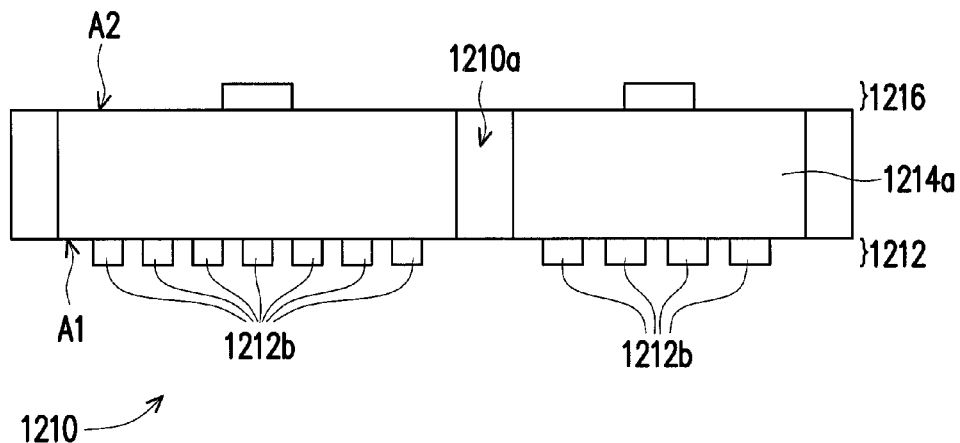
FIG. 15C is a cross-sectional diagram of the cable-side connector in FIG. 15A along line A-A.
Figure 15D:
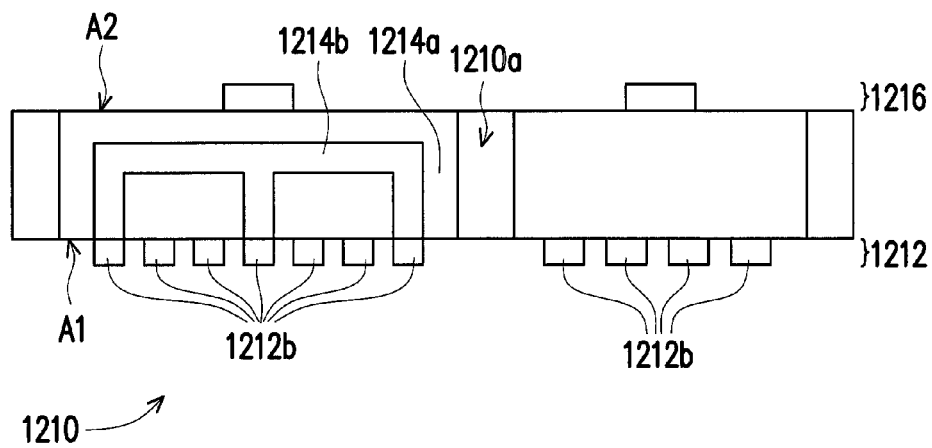
FIG. 15D is a schematic diagram of a modification of the printed circuit board in FIG. 15C.

Referring FIGS. 15C and 15D, these are cross-sectional diagrams of two examples of a printed circuit board 1210 of the cable-side connector in side-view. The two examples are similar to the examples of FIGS. 5C and 5D except that in the design of FIGS. 15C and 15D, no surface insulation layer is disposed, and the notation '1216' represents an electrical shielding layer for purpose of electrical shielding.

The printed circuit board 1210 is, for example, a single-layer printed circuit board or a laminated printed circuit board. The printed circuit board 1210 has an insulation core layer 1214a (inner insulation layer), a surface conductive trace layer 1212, an electrical shielding layer 1216 and a second positioning portion 1210c (aligning hole). The insulation core layer 1214a has a first surface A1 and a second surface A2 opposite to the first surface A1. The surface conductive trace layer 1212 is located at the first surface A1 of the insulation core layer 1214a and the surface conductive trace layer 1212 has a conductive trace pattern F. In addition, the second positioning portion 1210c (aligning hole) goes through the insulation core layer 1214a.

Referring to FIG. 15C, when terminals of other apparatus coupled to some of the contacting-end pattern portions 1212b, according to the specification, are connected to a reference level (for example, grounding), these contacting-end pattern portions 1212b should be electrically connected therebetween, for examples, they are electrically connected to each other through inner conductive traces so that the layout of the contacting-end pattern portions 1212b is more convenient.

Referring to FIG. 15D, the printed circuit board 1210 can additionally employ an inner conductive trace layer 1214b therein and the inner conductive trace layer 1214b is located between the surface conductive trace layer 1212 and the electrical shielding layer 1216 for electrically connecting some of the contacting-end pattern portions 1212b.

Board-Side Connector

Figure 16A:
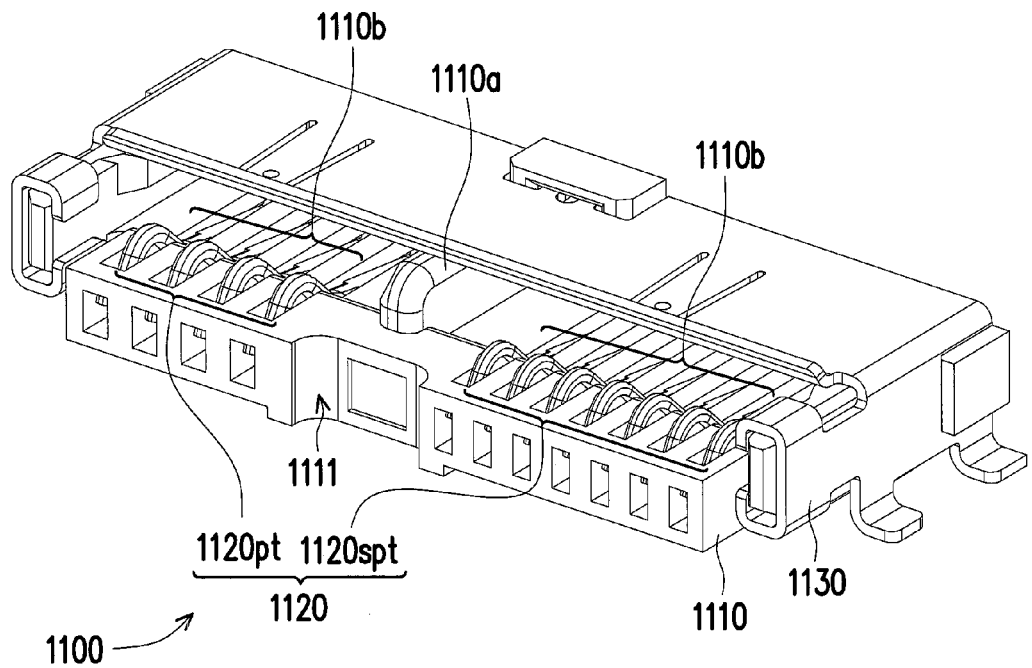
FIG. 16A is a perspective view of the board-side connector of FIG. 13.
Figure 16B:
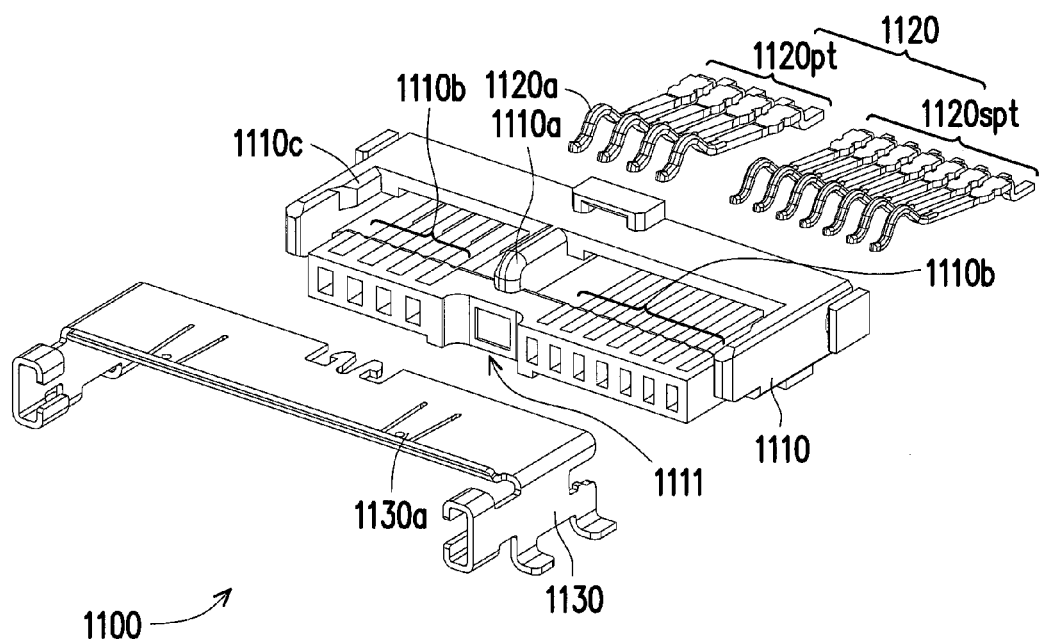
FIG. 16B is an exploded schematic diagram of the board-side connector of FIG. 16A.

Referring to FIGS. 16A and 16B, in addition to the foolproof structure 1110a, the insulation base 1110 of the board-side connector 1100 further includes a second aligning portion 1111 and is connected to the cable-side connector 1200 through the holding part f going through the second aligning portion 1111 (as shown by FIG. 11B).

Figure 14A:
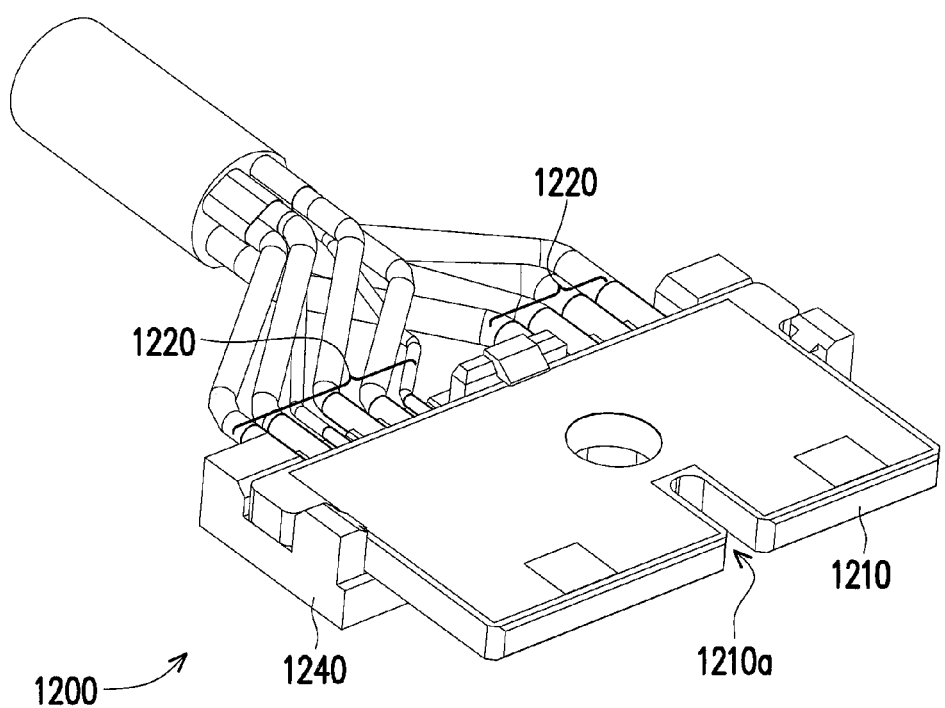
FIG. 14A is a perspective view of the cable-side connector of FIG. 11B.
Figure 14B:
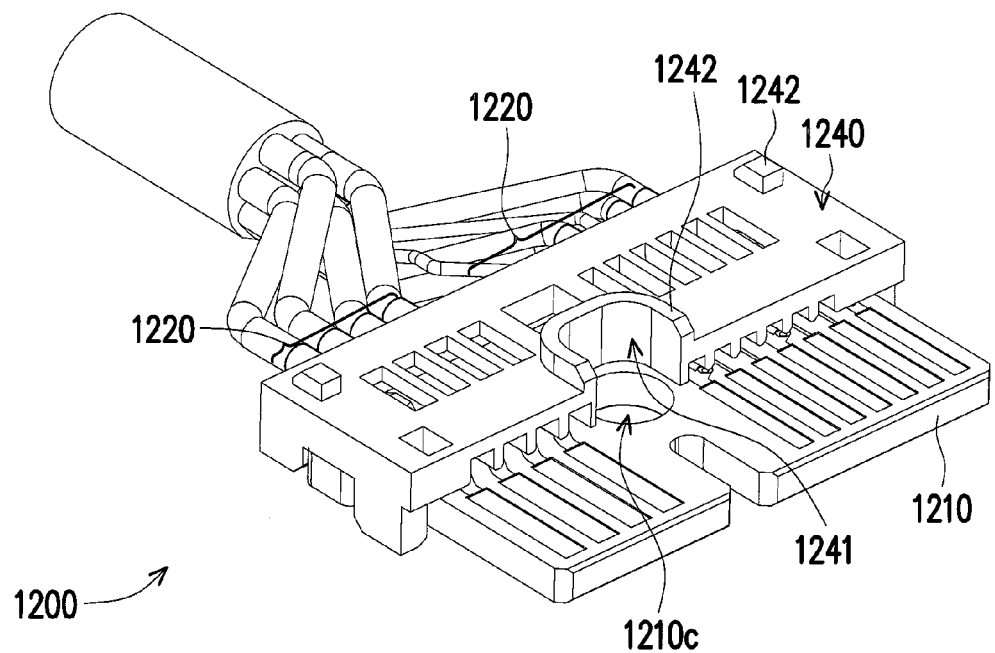
FIG. 14B is a perspective view of the cable-side connector of FIG. 11B in another angle of viewing.

Referring to FIGS. 14B and 16A, the first aligning portion 1241 of the cable-side connector 1200 is a groove formed at the edge of the second positioning portion 1210c (aligning hole) of the printed circuit board 1210, and the shape of the first aligning portion 1241 is roughly a semi-circle. The second aligning portion 1111 of the board-side connector 1100 is an edge groove formed at the insulation base 1110 and the shape of the second aligning portion 1111 is roughly a semi-circle. By means of the above-mentioned configuration, when the holding part f (as shown by FIG. 12) goes through the cable-side connector 1200 and the board-side connector 1100 and is fixed to the motherboard P, the space formed by the first aligning portion 1241 and the second aligning portion 1111 serves as an accommodation space for the holding part f. It should be noted that the first aligning portion 1241 and the second aligning portion 1111 are used to form the accommodation space for the holding part f, in which the shapes of the first aligning portion 1241 and the second aligning portion 1111 are, for example, semi-circles, which the invention is not limited to. In fact, as soon as long as the shapes are suitable to form an accommodation space for the holding part f, the shape designs fall in the scope of the invention.

In addition, the first aligning portion 1241 and the second aligning portion 1111 are located correspondingly to the leaning portion 1242 of the insulation cover 1240. In another unshown embodiment, the first aligning portion 1241 and the second aligning portion 1111 can be located without disposing correspondingly to the leaning portion.

Figure 17:
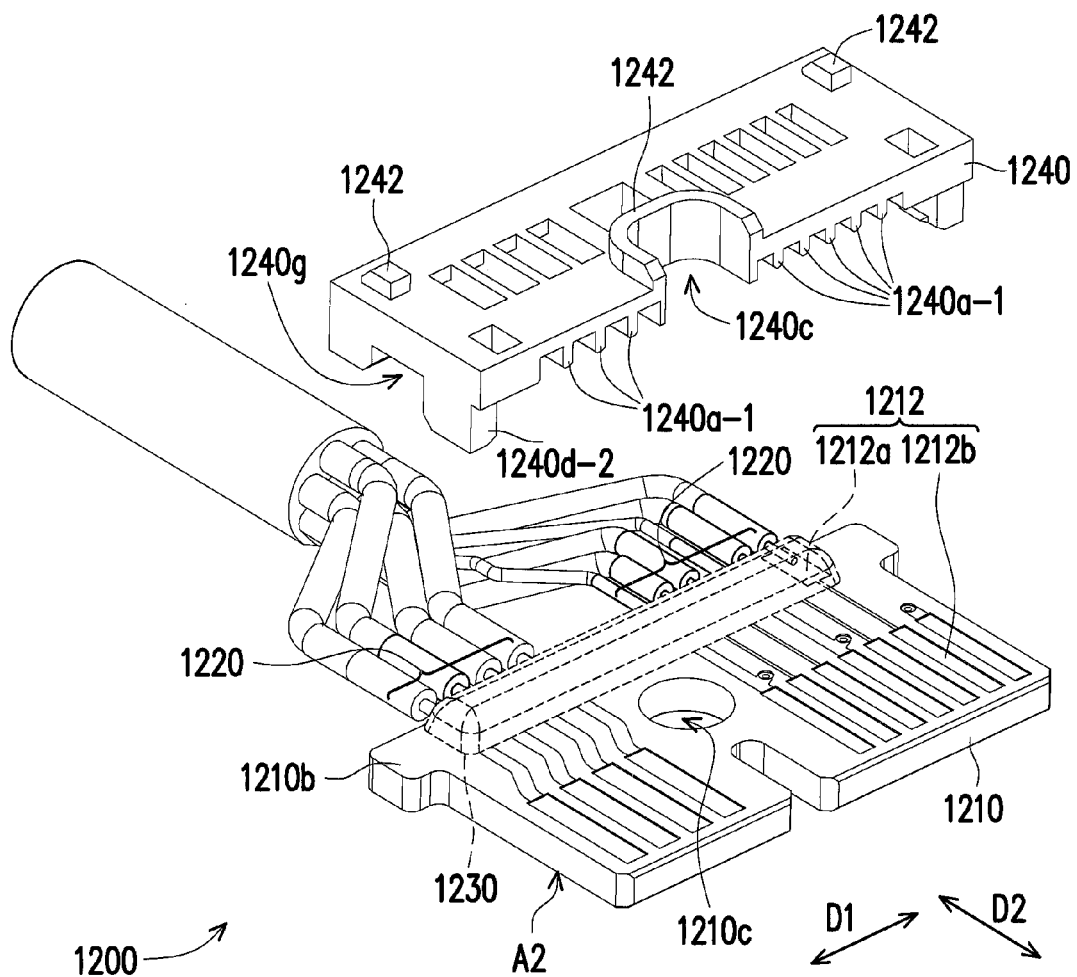
FIG. 17 is a schematic diagram showing assembling the insulation cover of FIG. 14A onto the printed circuit board.
Figure 18:
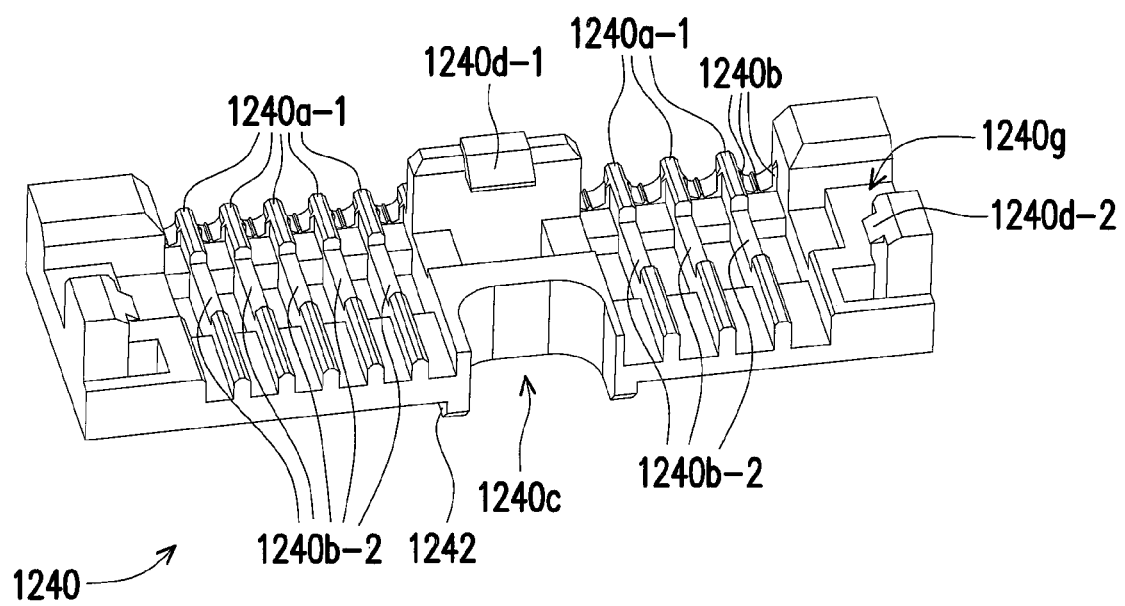
FIG. 18 is a perspective view of the insulation cover of the cable-side connector in FIG. 17 in another angle of viewing.
Figure 19:
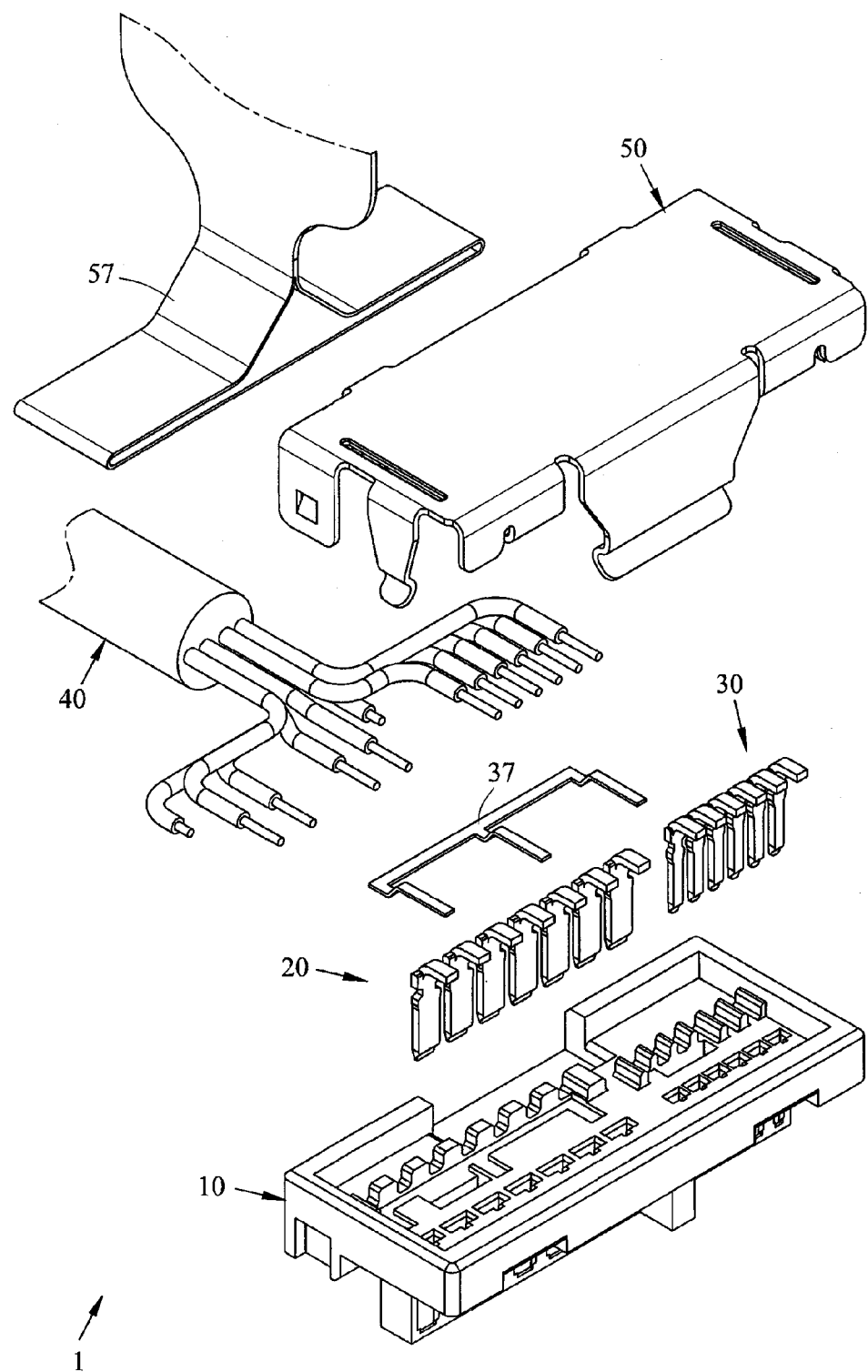
FIG. 19 is a perspective exploded schematic diagram of an SATA connector in the prior art.
Figure 20:
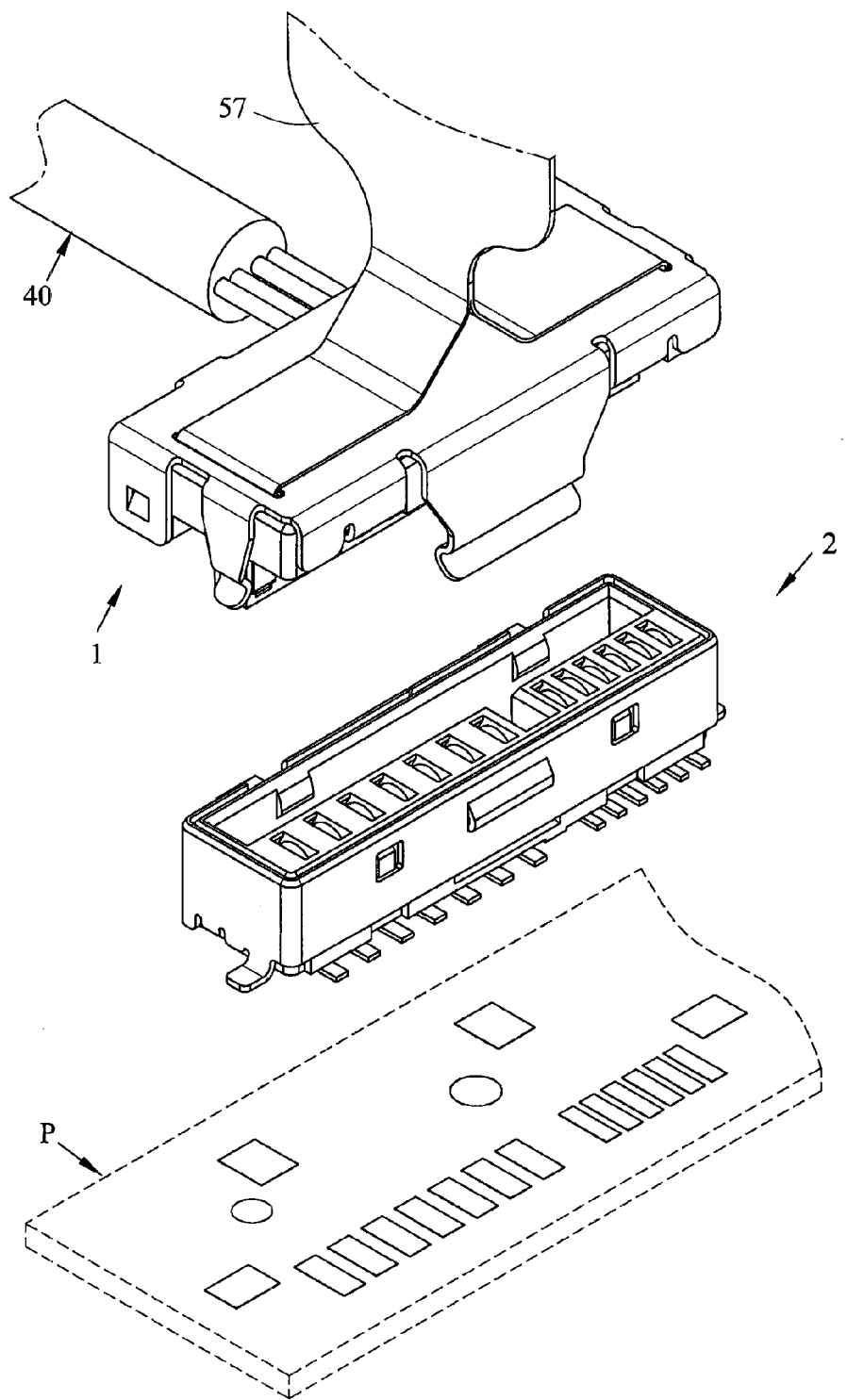
FIG. 20 is a schematic diagram showing assembling the SATA connector of FIG. 19.

Referring to FIGS. 17 and 18, the difference of the insulation cover of the embodiment from the insulation cover of FIG. 10 rests in that the insulation cover 1240 of the embodiment can have a positioning portion 1240g corresponding to the place of the flanges 1210b of the printed circuit board 1210. When the insulation cover 1240 is assembled to the printed circuit board 1210 (as shown by FIG. 14B), the flanges 1210b of the printed circuit board 1210 are fastened at the positioning portion 1240g of the insulation cover 1240 to make the printed circuit board 1210 and the insulation cover 1240 positioned, which facilitates the job that the holding part f goes through the cable-side connector 1200 to be fixed to the motherboard P (as shown by FIG. 12).

The insulation cover 1240 further has two second fastening portions 1240d-2 at both sides of the insulation cover 1240. When the second fastening portions 1240d-2 of the insulation cover 1240 is fastened onto the second surface A2 of the printed circuit board 1210 (as shown by FIG. 14A), the second fastening portions 1240d-2 limits the printed circuit board 1210 to move along the first direction D1 only, in which the first direction D1 in the embodiment is, for example, the transverse direction of the printed circuit board 1210. The first fastening portion 1240d-1 is located between the second fastening portions 1240d-2 and extends towards the first aligning portion 1240c. When the first fastening portion 1240d-1 of the insulation cover 1240 is fastened onto the second surface A2 of the printed circuit board 1210, the first fastening portion 1240d-1 limits the printed circuit board 1210 to move along the second direction D2 only, in which the second direction D2 is, for example, the lengthwise direction of the printed circuit board 1210.

What is claimed is:

1. A connector used for transmitting low-speed signal and/or high-speed signal, which is a cable-side connector comprising:
   a printed circuit board, comprising:
   a surface conductive trace layer having a conductive trace pattern, wherein the conductive trace pattern comprises a plurality of contacting-end pattern portions and a plurality of bonding pad portions;
   an inner insulation layer, located on the surface conductive trace layer;
   a ground layer, located on the inner insulation layer; and
   a surface insulation layer, overlaying the ground layer and exposing out a part of the ground layer; and a plurality of cables, electrically connected to the bonding pad portions of the conductive trace pattern.

2. The connector as claimed in claim 1, wherein an inner conductive trace layer is disposed in the inner insulation layer and located between the surface conductive trace layer and the ground layer;
    the ground layer has a portion providing the contacting-end pattern portions to electrically connect each other and a portion providing electromagnetic shielding, and the above-mentioned two portions are insulated from each other;
    wherein at least two of the contacting-end pattern portions are electrically connected to each other through the inner conductive trace layer and together electrically connected to a reference level.

3. The connector as claimed in claim 1, wherein the conductive trace pattern of the surface conductive trace layer has a connection wire; wherein at least two of the contacting-end pattern portions are electrically connected to each other through the connection wire and together electrically connected to a reference level.

4. The connector as claimed in claim 1, further comprising an insulation cover disposed nearby the connection place between the cables and the bonding pad portions, wherein the insulation cover has a plurality of lengthwise walls corresponding to the figures of the cables and the cables are clamped by assembling the insulation cover and the printed circuit board;
    wherein the lengthwise walls have a plurality of transverse grooves, each of the lengthwise walls has at least one protrusive rib at a side thereof, the insulation cover has a first positioning portion and a fastening portion, the printed circuit board has a second positioning portion, the first positioning portion and the second positioning portion are positioned by inserting each other, and the fastening portion is fastened at the printed circuit board.

5. The connector as claimed in claim 1, further comprising a protective glue overlaying partial the cables and partial the bonding pad portions so as to protect the connections between the cables and the surface conductive trace layer,
    wherein the printed circuit board has two flanges respectively at both sides thereof, the ground layer extends to overlay the flanges and the surface insulation layer exposes out the ground layer located on the flanges;
    the printed circuit board has a first foolproof structure, wherein the first foolproof structure has a lengthwise rib or a lengthwise recess,
    and the cables are single core or multi cores and the cables comprise at least one pair of differential-signal wires.

6. The connector as claimed in claim 1, wherein the contacting-end pattern portions comprise a plurality of power/low-speed signal contacting-end patterns and a plurality of high-speed signal contacting-end patterns, and an interval between the power/low-speed signal contacting-end patterns is greater than an interval between the high-speed signal contacting-end patterns;
    wherein the pin definitions of the power/low-speed signal contacting-end patterns and the pin definitions of the high-speed signal contacting-end patterns of the contacting-end pattern portions are pin definitions of USB2.0, pin definition of SATA power terminal or pin definition of eSATA power terminal.

7. The connector as claimed in claim 1, wherein the contacting-end pattern portions comprise a plurality of power/low-speed signal contacting-end patterns and a plurality of high-speed signal contacting-end patterns, and a width of each of the power/low-speed signal contacting-end patterns is greater than a width of each of the high-speed signal contacting-end patterns; wherein the pin definitions of the power/low-speed signal contacting-end patterns and the pin definitions of the high-speed signal contacting-end patterns of the contacting-end pattern portions are pin definitions of USB2.0, pin definition of SATA power terminal or pin definition of eSATA power terminal.

8. A connector used for transmitting low-speed signal and/or high-speed signal, which is a board-side connector comprising:
    an insulation base, comprising a second foolproof structure and a plurality of slots, wherein the second foolproof structure is a lengthwise rib or a lengthwise recess;
    a plurality of first terminals, respectively inserted in the slots and respectively having a protrusive portion protruded from the slots; and
    a shielding shell enclosing partial the insulation base and exposing the protrusive portions of the first terminals and portions of the slots close to the protrusive portions, wherein the protrusive portions of the first terminals and the shielding shell together form a guiding path;
    wherein the shielding shell has at least one electrical leaning portion, the electrical leaning portion is suitable to electrically connect a ground portion of a cable-side connector to form an electromagnetic shielding structure, and the shielding shell has two inward protrusive portions at both sides thereof to limit a movement of the cable-side connector.

9. The connector as claimed in claim 8, wherein the guiding path is an obliquely guiding path for the cable-side connector to be obliquely inserted and assembled to the board-side connector and the cable-side connector has a main body formed by a printed circuit board;
    wherein the insulation base has two extension walls with gradually changed thicknesses at both sides thereof and the extension walls are connected to the shielding shell, and
    the electrical leaning portion is protrusive point, protrusive line or protrusive surface and formed by bending a portion of the shielding shell or is an elastic plate formed by partial the shielding shell.

10. The connector as claimed in claim 8, wherein the first terminals comprise a plurality of power/low-speed signal terminals and high-speed terminals and an interval between the power/low-speed signal terminals is greater than an interval between the high-speed signal terminals; wherein the pin definitions of the power/low-speed signal terminals and the pin definitions of the high-speed signal terminals are pin definitions of USB2.0, pin definition of SATA power terminal or pin definition of eSATA power terminal.

11. The connector as claimed in claim 8, wherein the first terminals comprise a plurality of power/low-speed signal terminals and high-speed terminals and a width of each of the power/low-speed signal terminals is greater than a width of each of the high-speed signal terminals; wherein the pin definitions of the power/low-speed signal terminals and the pin definitions of the high-speed signal terminals are pin definitions of USB2.0, pin definition of SATA power terminal or pin definition of eSATA power terminal.

12. A connector used for transmitting low-speed signal and/or high-speed signal, which is a cable-side connector comprising:
    a printed circuit board, comprising:
        an insulation core layer having a first surface and a second surface opposite to the first surface and an aligning hole going through the insulation core layer;

a surface insulation layer, located at the first surface and having a conductive trace pattern; and an electrical shielding layer, located at the second surface;

a plurality of cables, electrically connected to the conductive trace pattern;

an insulation cover, which and the printed circuit board together clamp the cables and comprises at least one leaning portion, wherein the leaning portion is suitable to lean against a motherboard; and a holding part, going through the aligning hole and the motherboard to fix the cable-side connector onto the motherboard.

13. The connector as claimed in claim 12, wherein the insulation cover has a first aligning portion and the first aligning portion is a groove formed at an edge of the aligning hole so as to accommodate the holding part;

the motherboard has a case main board and a circuit main board, the circuit main board is located between the case main board and the cable-side connector and the leaning portion of the insulation cover is contacted the circuit main board;

wherein the case main board has a thread pillar, the thread pillar has an inner thread, the holding part goes through the printed circuit board to be fixed in the inner thread of the thread pillar and the holding part is a screw.

14. The connector as claimed in claim 12, wherein the motherboard has a case main board and a circuit main board, the circuit main board is located between the case main board and the insulation cover and the leaning portion of the insulation cover is contacted the circuit main board; wherein the case main board has an opening, the holding part goes through the printed circuit board to be fastened in the opening of the case main board and the holding part is a plastic fastening part.

15. The connector as claimed in claim 12, wherein the motherboard has a case main board and a circuit main board, the circuit main board is located between the case main board and the insulation cover and the leaning portion of the insulation cover is contacted the circuit main board; wherein the circuit main board has a through hole, the holding part goes through the printed circuit board to be fastened in the through hole of the circuit main board and the holding part is a plastic fastening part.

16. The connector as claimed in claim 12, wherein the printed circuit board has two flanges respectively at both sides thereof, the insulation cover has a plurality of positioning portions corresponding to the flanges and the flanges are fastened at the positioning portions; wherein the insulation cover has a plurality of lengthwise walls disposed correspondingly to the figures of the cables and the cables are clamped by assembling the insulation cover and the printed circuit board, the printed circuit board has a first foolproof structure, wherein the first foolproof structure is a lengthwise rib or a lengthwise recess and the cables comprise at least one pair of differential-signal wires.

17. The connector as claimed in claim 12, wherein the insulation cover has a first fastening portion and a second fastening portion, the first fastening portion is fastened to the printed circuit board and the second fastening portion is fastened to the printed circuit board; wherein the first fastening portion is for limiting the printed circuit board to move along the first direction only and the second fastening portion is for limiting the printed circuit board to move along the second direction only, wherein the first direction is a transverse direction of the printed circuit board and the second direction is a lengthwise direction of the printed circuit board.

18. A connector used for transmitting low-speed signal and/or high-speed signal, which is a board-side connector comprising:

an insulation base, comprising a second foolproof structure and a plurality of slots, wherein the second foolproof structure is a lengthwise rib or a lengthwise recess;

a plurality of first terminals, respectively inserted in the slots and having a protrusive portion protruded from the slots; and a shielding shell enclosing partial the insulation base, wherein the protrusive portions of the first terminals and the shielding shell together form a guiding path, the shielding shell has at least one electrical leaning portion suitable to electrically connect an electrical shielding layer of a cable-side connector to form an electromagnetic shielding structure;

wherein the insulation base is for a holding part to go through the base so as to fix with the cable-side connector.

19. The connector as claimed in claim 18, wherein the insulation base has a second aligning portion, the second aligning portion is a groove formed at an edge of the insulation base and goes through the insulation base so as to accommodate the holding part going through the second aligning portion.

20. The connector as claimed in claim 18, wherein the electrical leaning portion is an elastic plate formed by a part of the shielding shell, the insulation base has two extension walls at both sides thereof and the extension walls are connected to the shielding shell.

* * * * *